United States Patent
Yu et al.

(10) Patent No.: US 9,741,694 B2
(45) Date of Patent: Aug. 22, 2017

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chen-Hua Yu, Hsinchu (TW); Ming-Fa Chen, Taichung (TW); Sung-Feng Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/985,461

(22) Filed: Dec. 31, 2015

(65) Prior Publication Data
US 2017/0194291 A1    Jul. 6, 2017

(51) Int. Cl.
*H01L 21/68*    (2006.01)
*H01L 25/065*    (2006.01)
(Continued)

(52) U.S. Cl.
CPC ...... *H01L 25/0657* (2013.01); *H01L 21/6835* (2013.01); *H01L 21/76898* (2013.01); *H01L 23/481* (2013.01); *H01L 24/83* (2013.01); *H01L 25/50* (2013.01); *H01L 2221/68327* (2013.01); *H01L 2224/838* (2013.01); *H01L 2224/83801* (2013.01); *H01L 2224/83805* (2013.01); *H01L 2224/83895* (2013.01); *H01L 2224/83896* (2013.01); *H01L 2225/06541* (2013.01); *H01L 2225/06548* (2013.01); *H01L 2225/06572* (2013.01)

(58) Field of Classification Search
CPC ........... H01L 21/6835; H01L 21/76898; H01L 23/481; H01L 24/83; H01L 25/657; H01L 25/50
See application file for complete search history.

(56) References Cited

U.S. PATENT DOCUMENTS

2007/0170574 A1* 7/2007 Lauxtermann .... H01L 21/76898 257/686
2011/0042820 A1* 2/2011 Knickerbocker . H01L 21/76898 257/774

(Continued)

*Primary Examiner* — Whitney T Moore
*Assistant Examiner* — Joseph Galvin, III
(74) *Attorney, Agent, or Firm* — WPAT, P.C., Intellectual Property Attorneys; Anthony King

(57) ABSTRACT

A semiconductor structure and a method for forming the same are provided. The method comprises: providing a first semiconductor workpiece; bonding a second semiconductor workpiece to a first surface of the first semiconductor workpiece; forming a first electrically conductive via through the second semiconductor workpiece to the first semiconductor workpiece; bonding a third semiconductor workpiece to a second surface of the first semiconductor workpiece, the second surface being opposite to the first surface; and forming a second electrically conductive via through the first semiconductor workpiece and the third semiconductor workpiece to the second semiconductor workpiece such that the first electrically conductive via and the second electrically conductive via are electrically connected.

20 Claims, 55 Drawing Sheets

(51) Int. Cl.
*H01L 25/00* (2006.01)
*H01L 21/768* (2006.01)
*H01L 23/00* (2006.01)
*H01L 21/683* (2006.01)
*H01L 23/48* (2006.01)

(56) References Cited

U.S. PATENT DOCUMENTS

| | | | |
|---|---|---|---|
| 2012/0056319 A1* | 3/2012 | Yun | H01L 23/5389 257/737 |
| 2012/0074582 A1* | 3/2012 | Yu | H01L 21/486 257/774 |
| 2012/0193785 A1* | 8/2012 | Lin | H01L 21/76229 257/737 |
| 2013/0168803 A1* | 7/2013 | Haddad | H01L 21/50 257/507 |

* cited by examiner

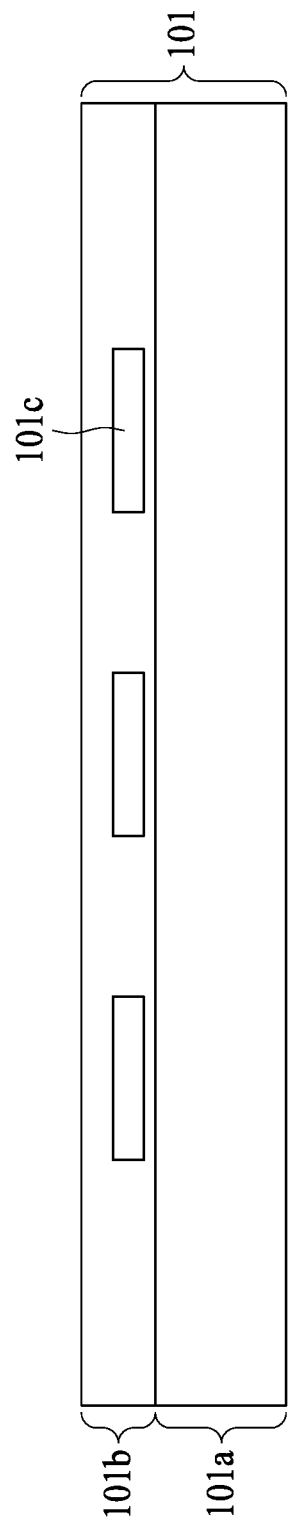

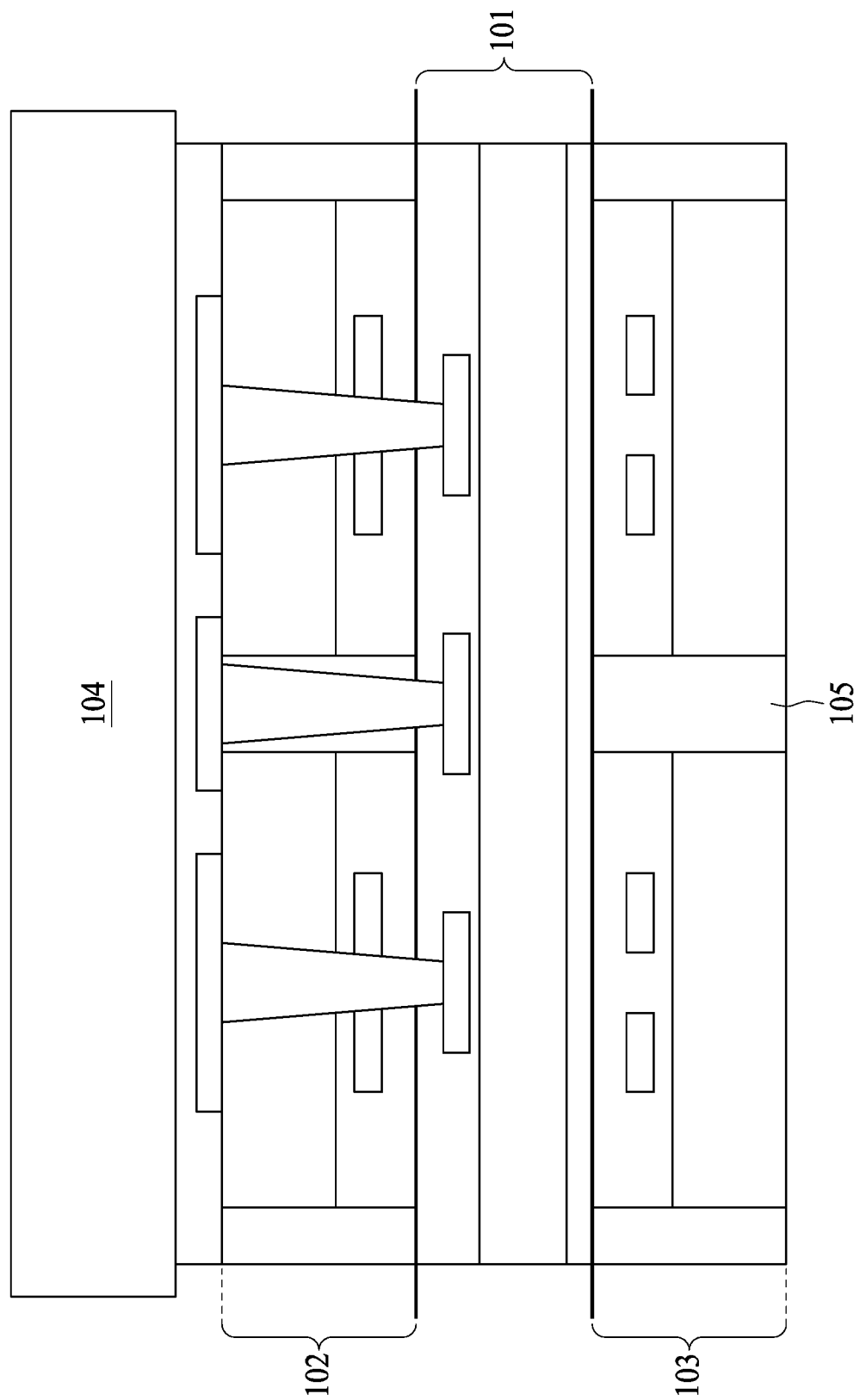

SEMICONDUCTOR STRUCTURE AND METHOD OF MANUFACTURING THE SAME

FIELD

The present disclosure relates generally to a semiconductor structure and more particularly relates to a semiconductor structure comprising a low modulus substrate.

BACKGROUND

Since the invention of integrated circuits, the semiconductor industry has experienced continuous rapid growth due to constant improvements in the integration density of various electronic components and semiconductor packages. For the most part, these improvements in integration density have come from repeated reductions in minimum feature size, allowing more components to be integrated into a semiconductor chip or package.

One approach for allowing more components to be integrated into a semiconductor structure is the adoption of three dimensional integrated circuit (3D IC) stacking techniques, in which silicon wafers and/or dies are stacked on one another and vertically interconnected using through vias so that they behave as a single device to achieve performance improvements than conventional two dimensional processes. However, conventional techniques for 3D IC stacking merely allow stacking wafers and/or dies on one side of a base substrate/wafer. Accordingly, what is needed are semiconductor structures with wafers and/or dies stacked on both sides of the base substrate/wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
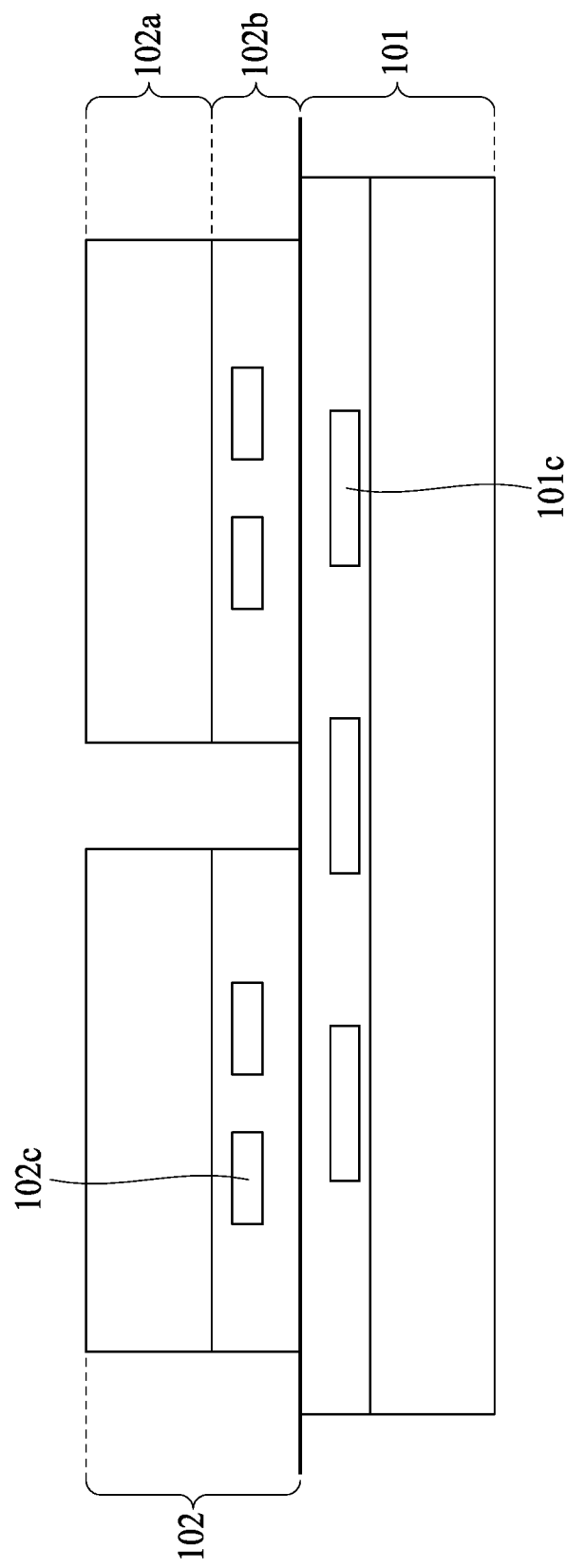
FIGS. 1A-1R schematically illustrate a method of manufacturing a semiconductor structure in accordance with one embodiment of the present disclosure.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps (operations) and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1C:
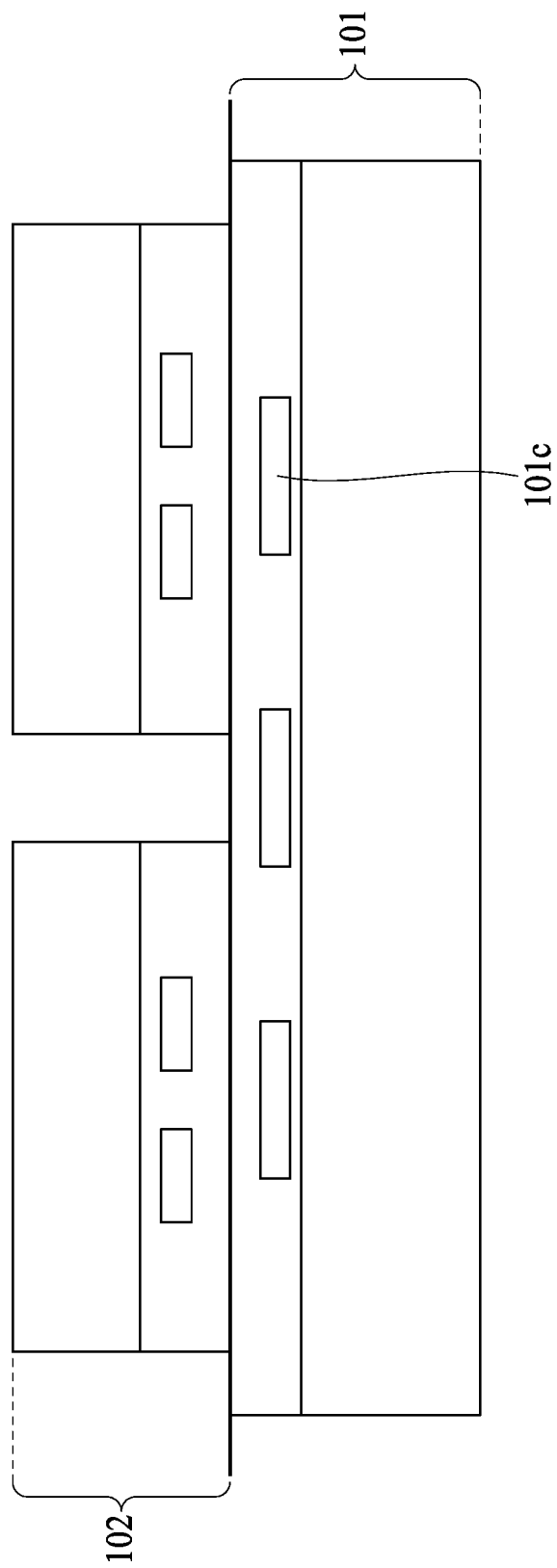
Figure 1D:
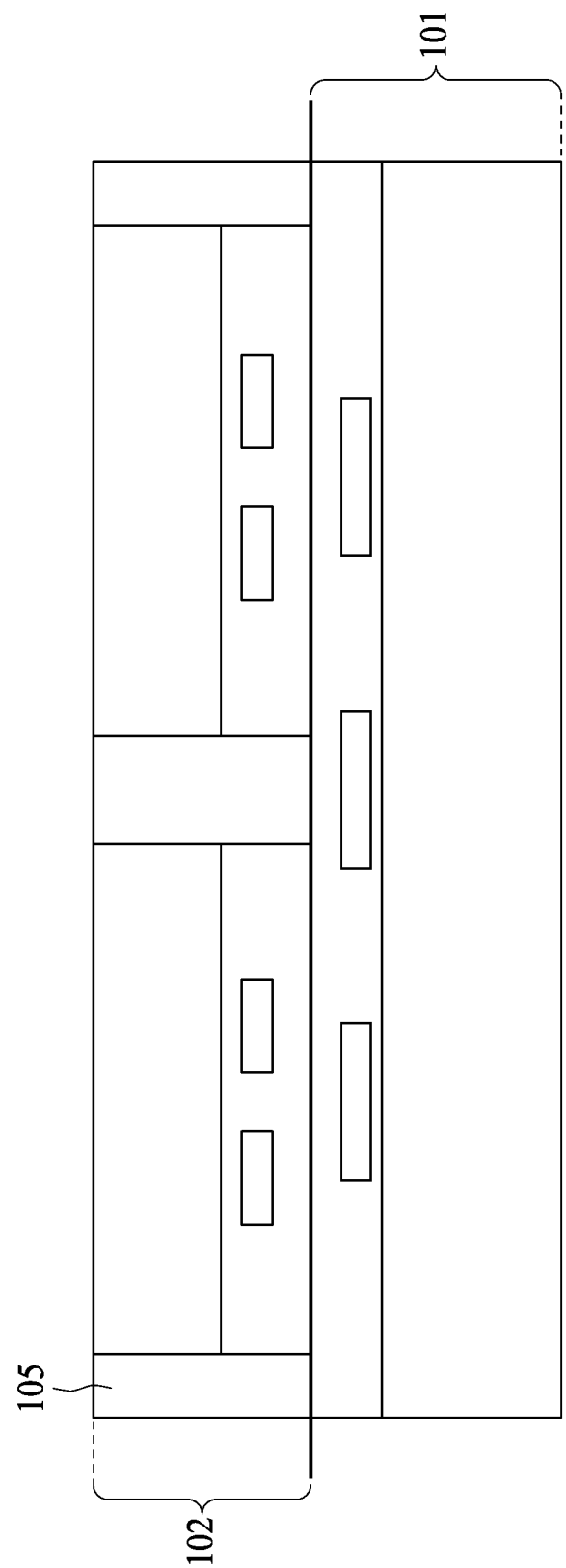
Figure 1E:
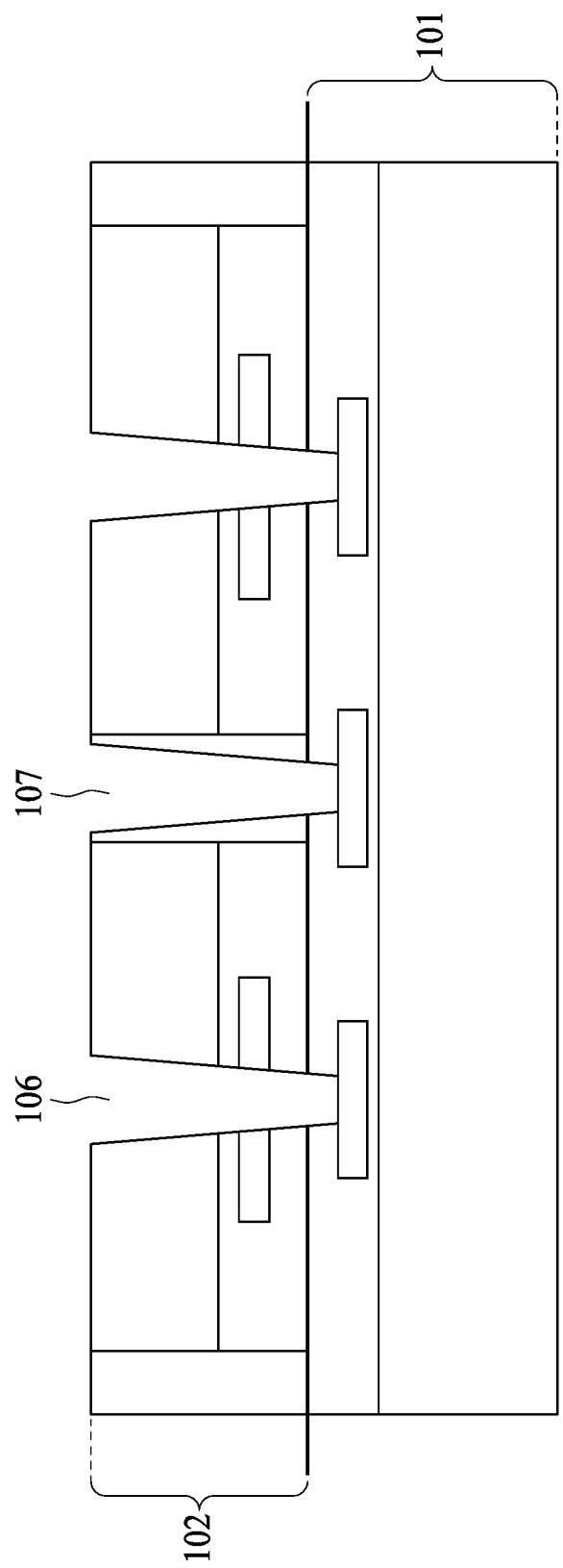
Figure 1F:
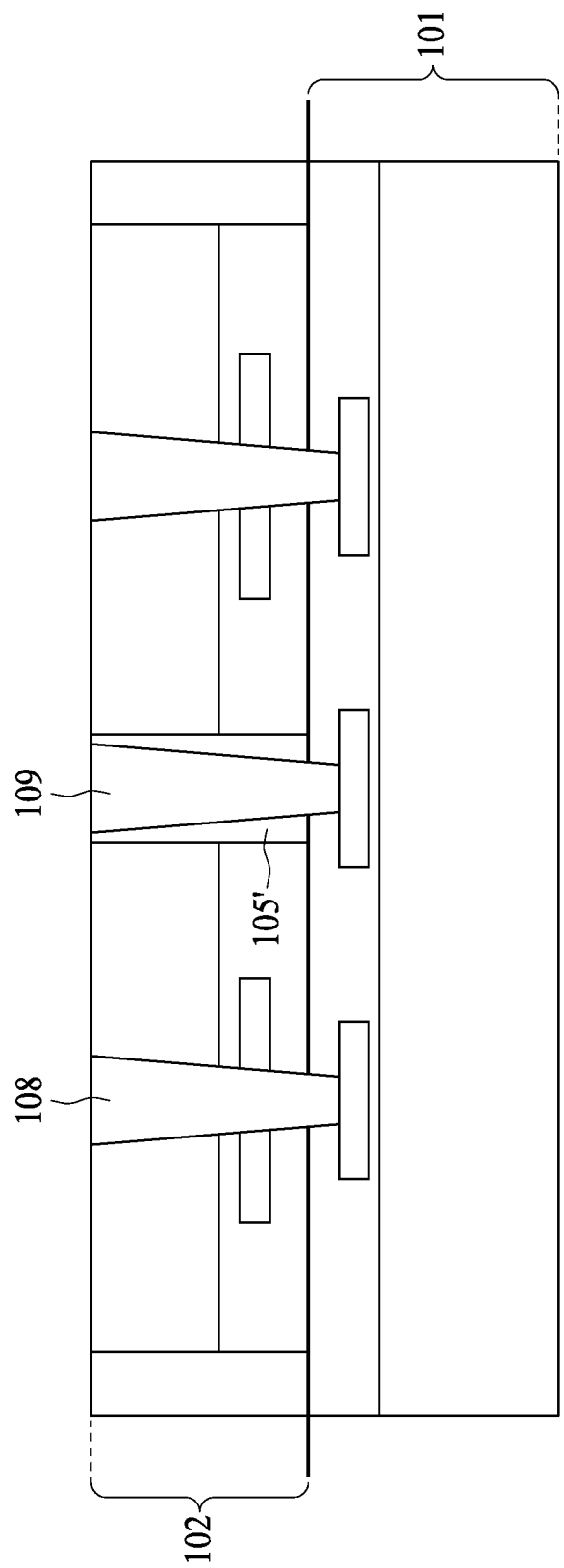
Figure 1G:
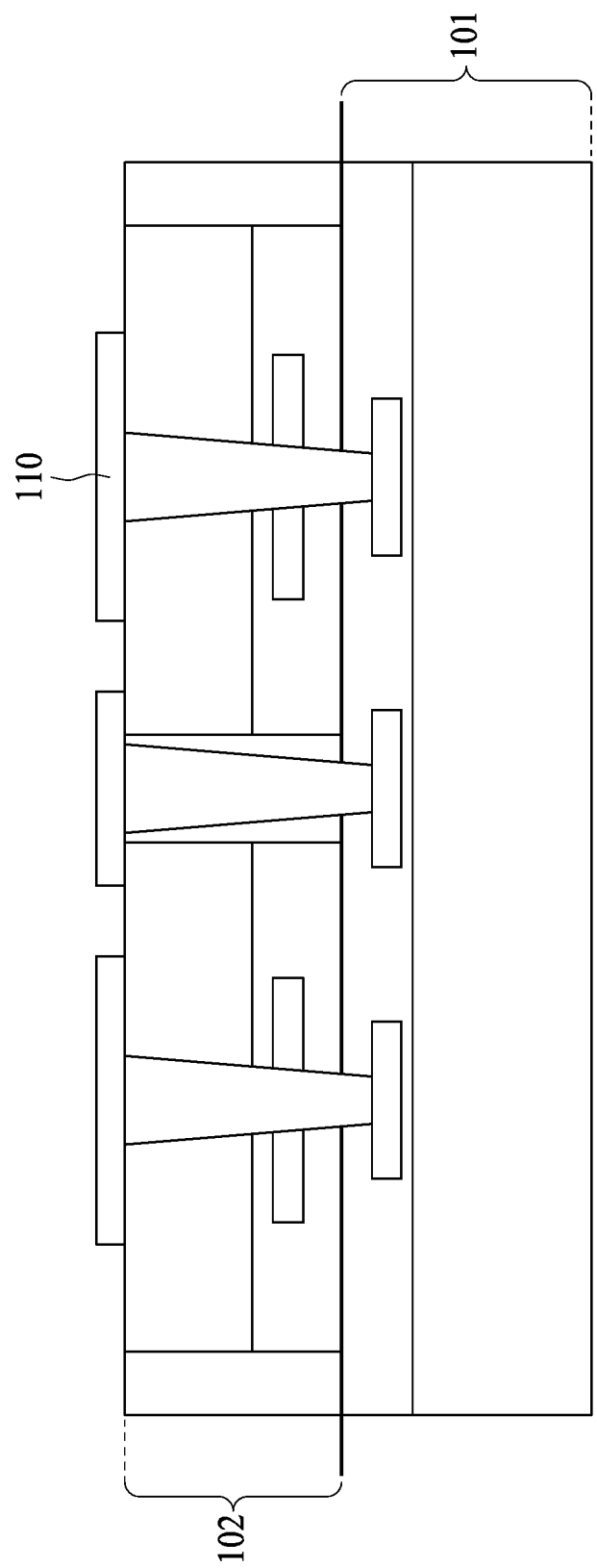
Figure 1H:
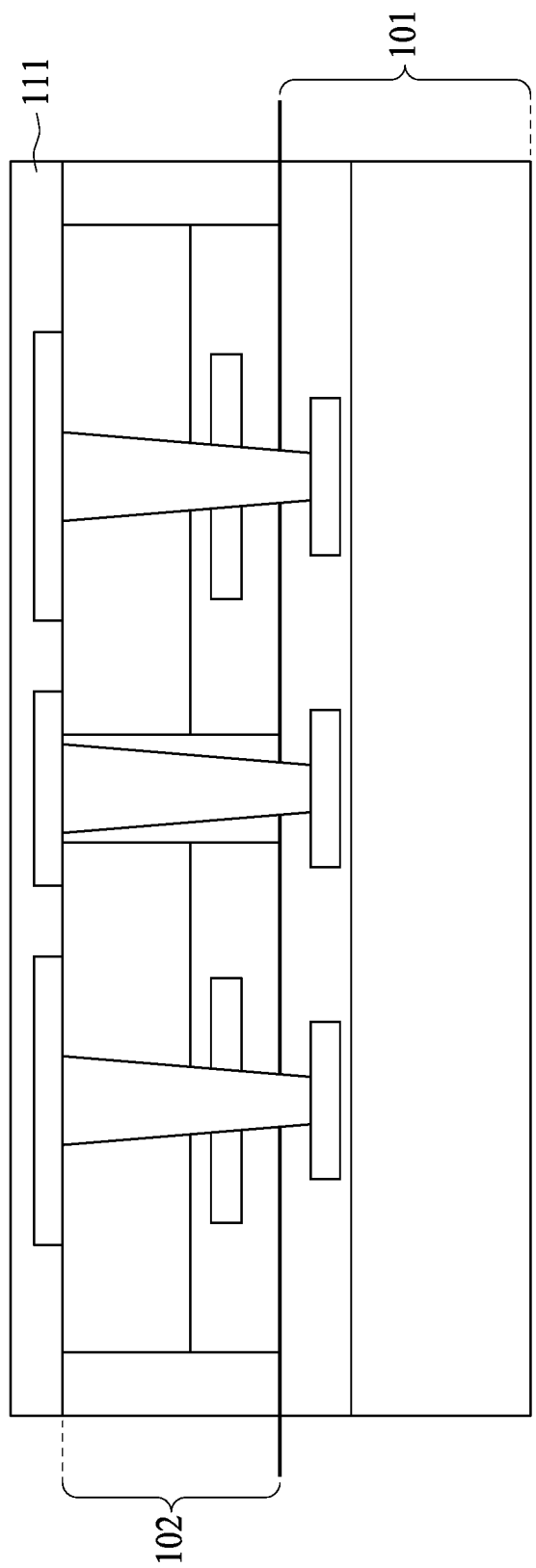
Figure 1I:
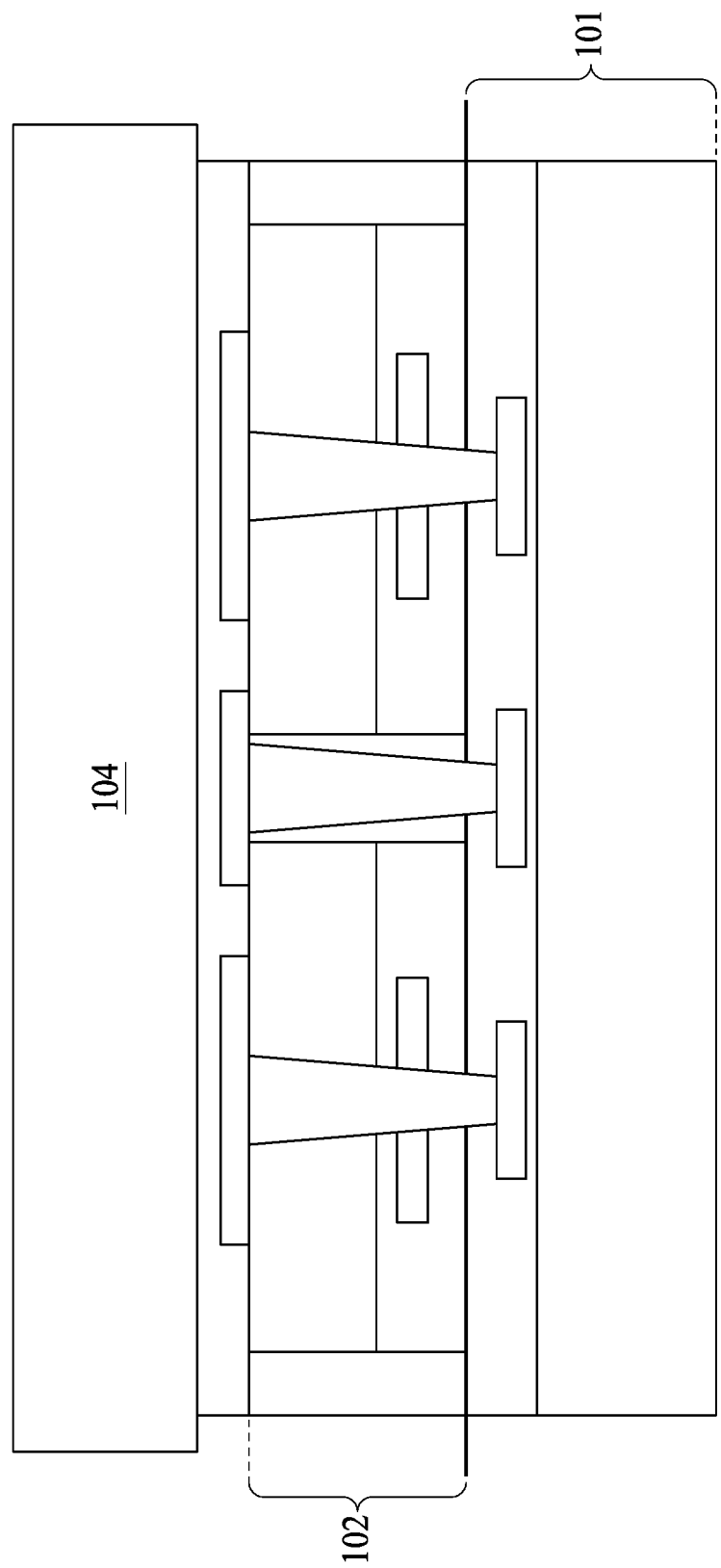
Figure 1J:
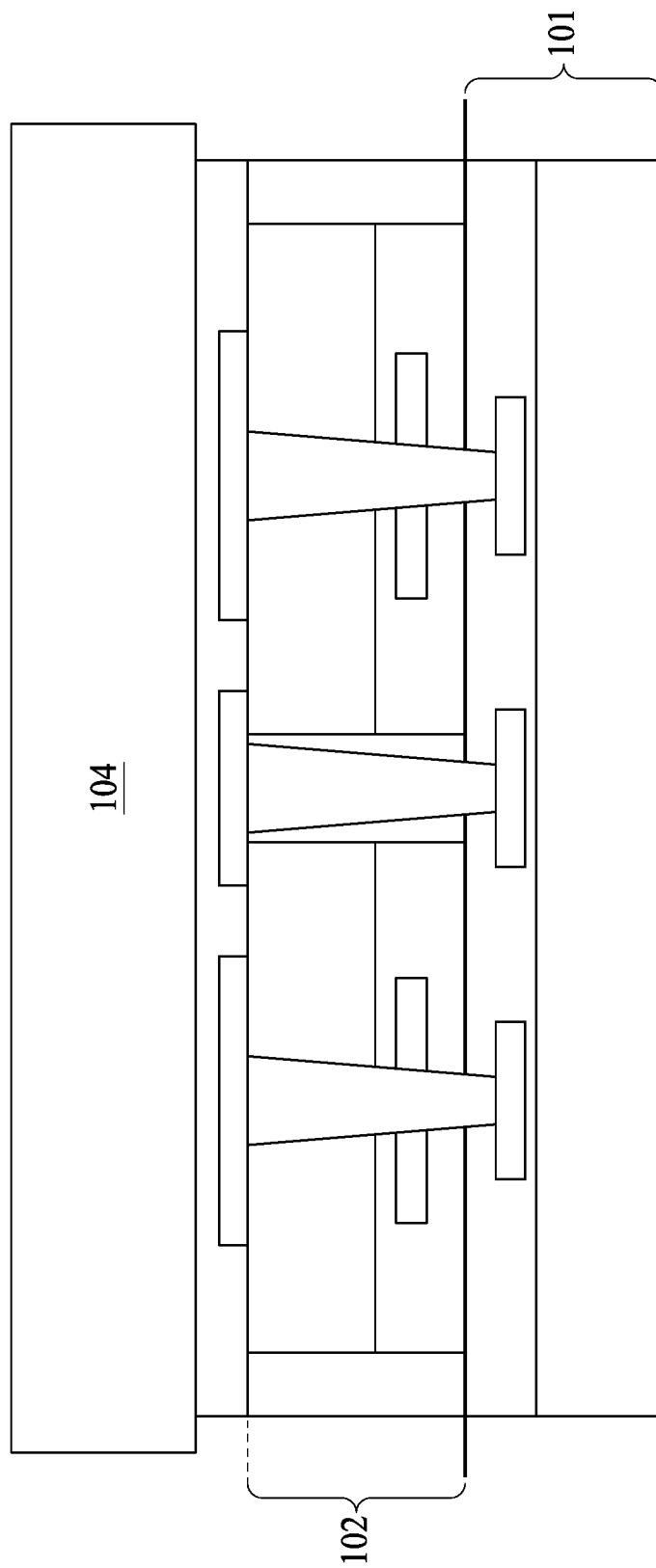
Figure 1K:
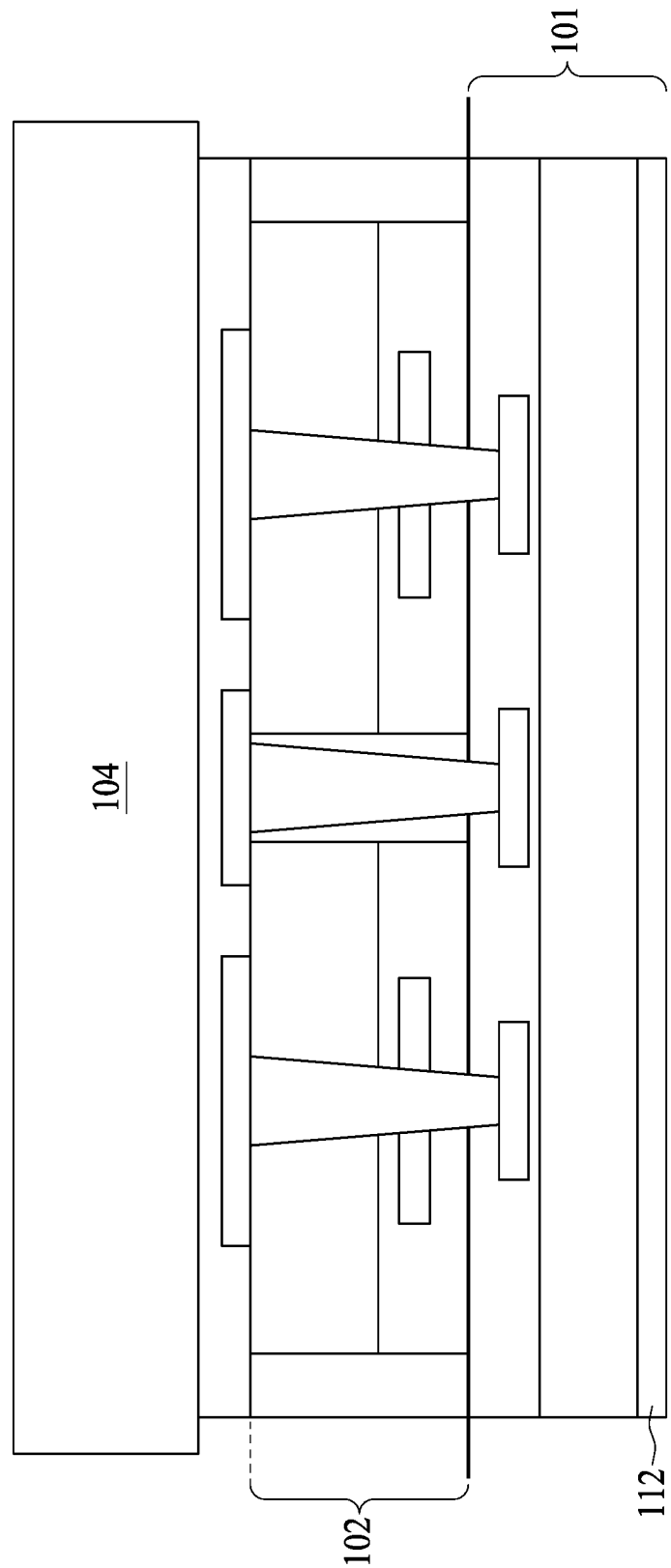
Figure 1L:
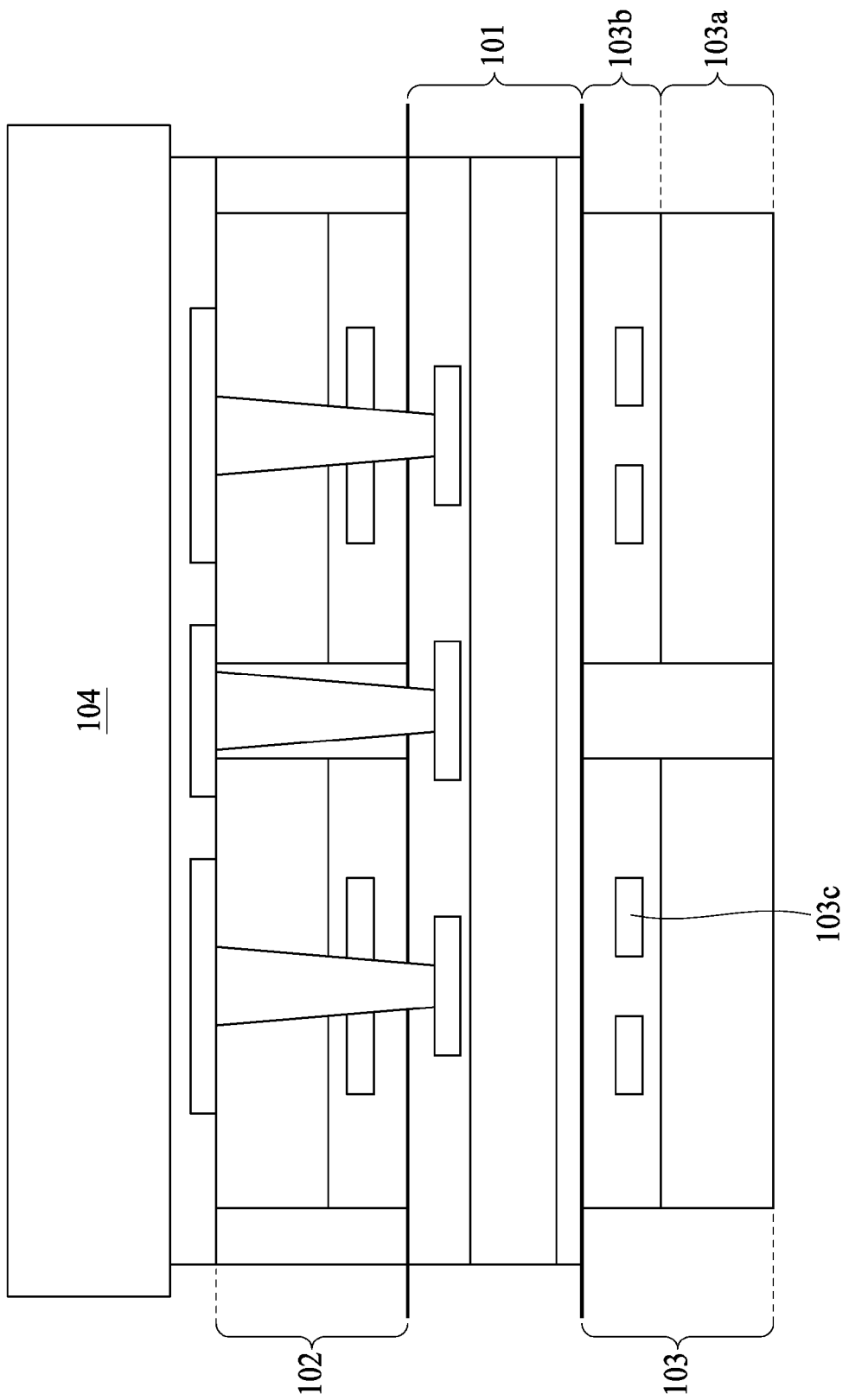
Figure 1N:
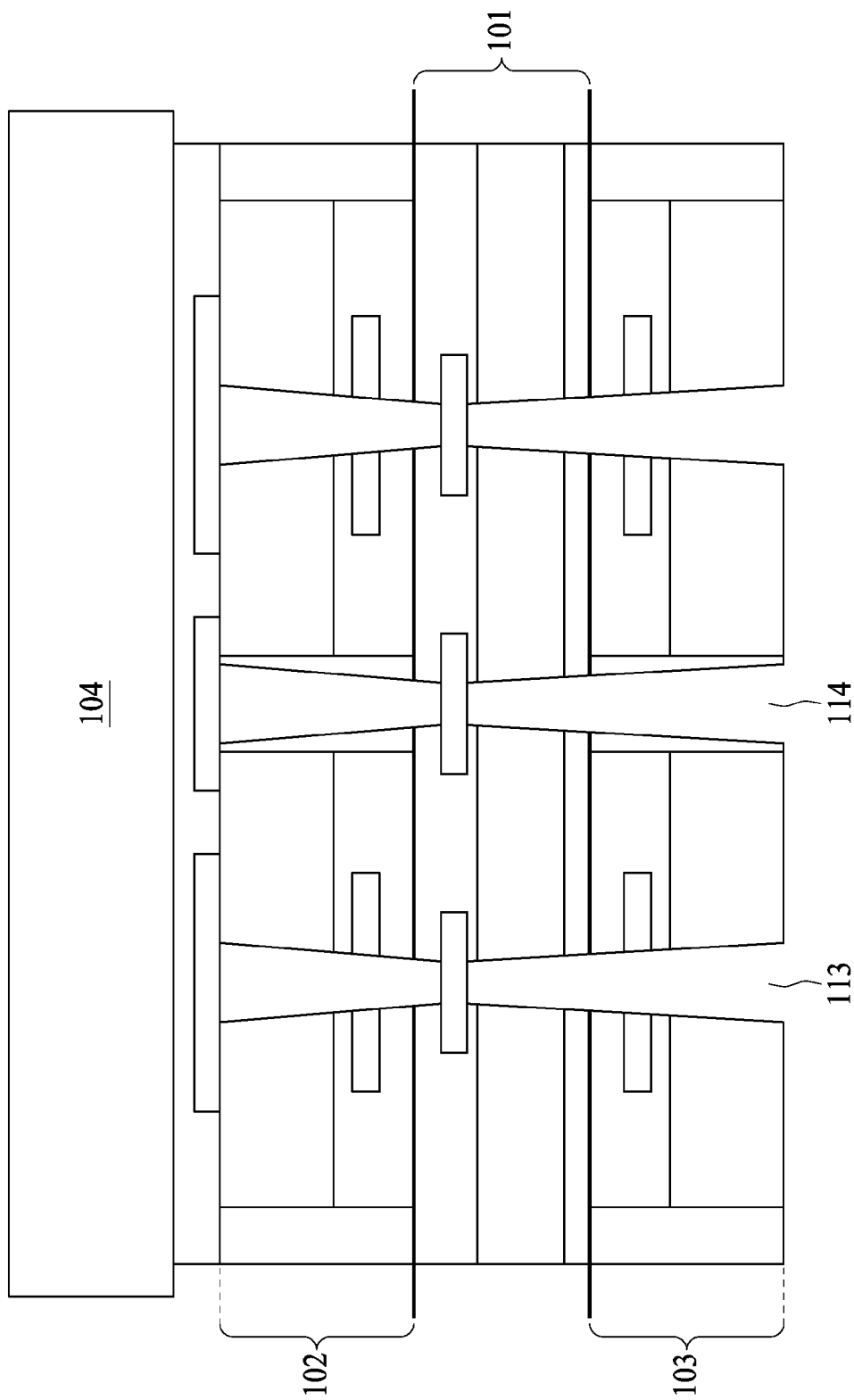
Figure 1O:
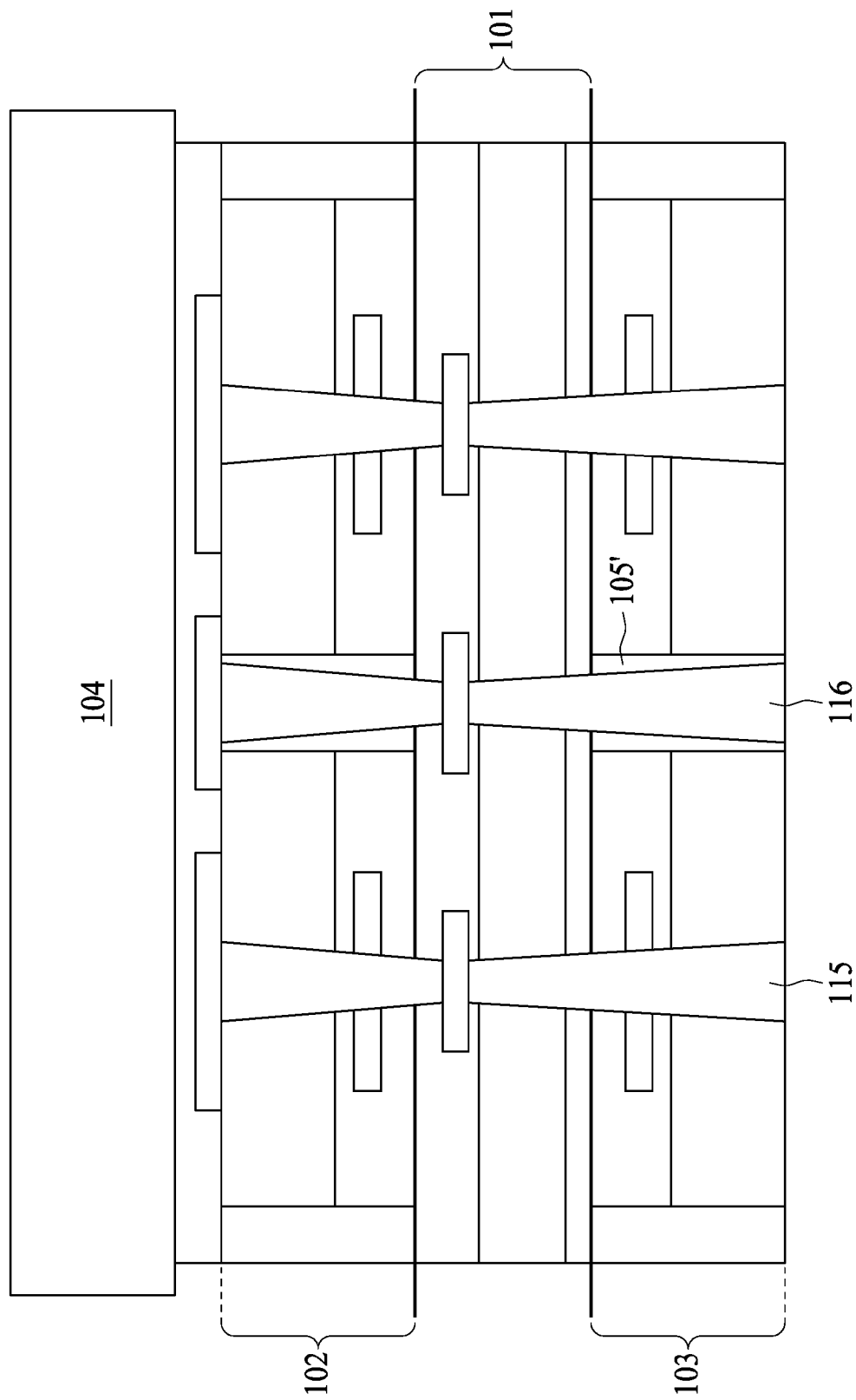
Figure 1P:
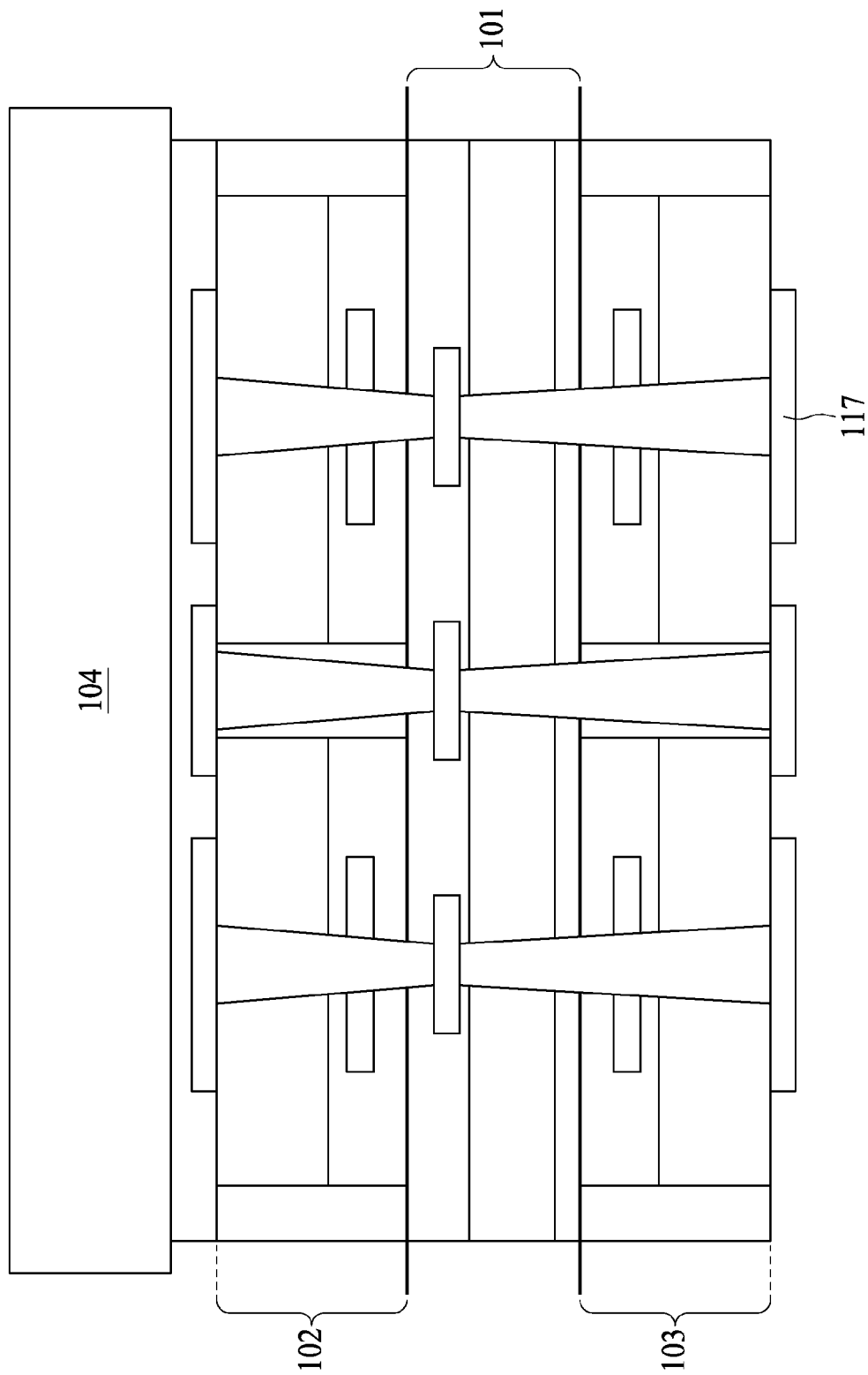
Figure 1Q:
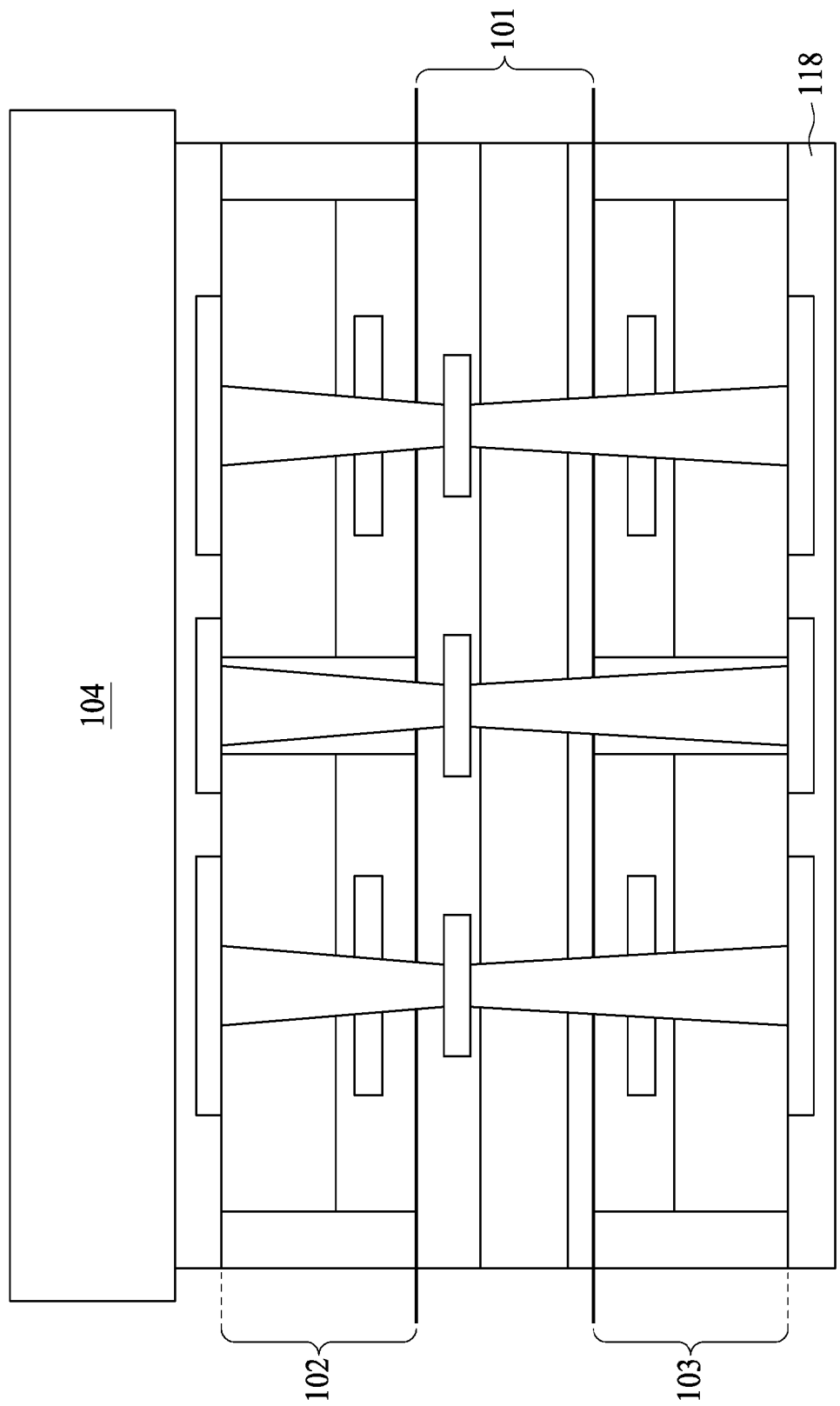
Figure 1R:
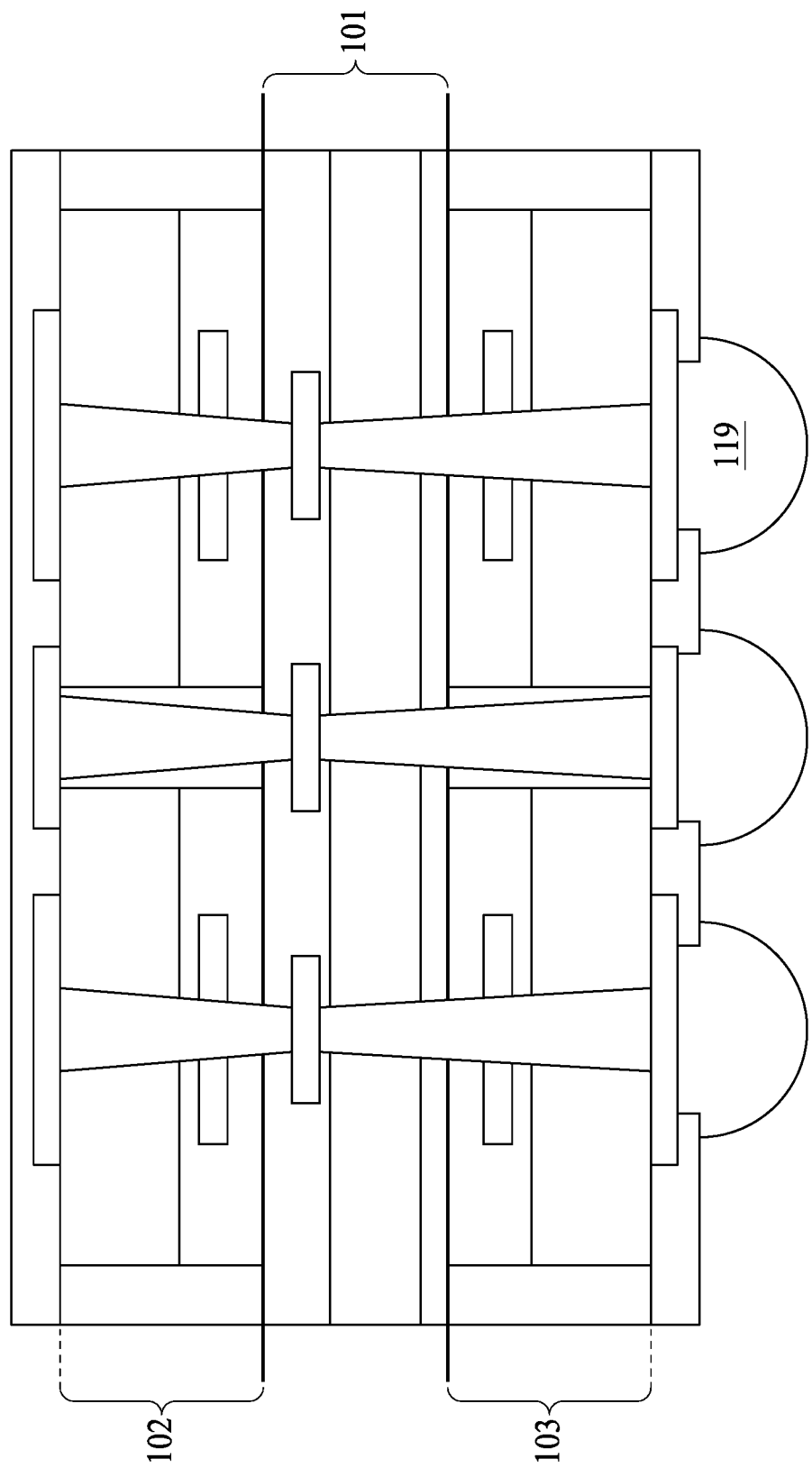

In reference to the drawings, FIGS. 1A-1R schematically illustrate operations for manufacturing a semiconductor structure in accordance with a first embodiment of the present disclosure.

In FIG. 1A, a first semiconductor workpiece 101 is provided. The first semiconductor workpiece 101 may comprise a first substrate 101a and a first active layer 101b. The first substrate 101a may include multi-layered substrates, gradient substrates, hybrid orientation substrates, any combinations thereof and/or the like. The materials for the first substrate 101a include bulk silicon, a semiconductor wafer, a silicon-on-insulator (SOI) substrate, or a silicon germanium substrate. Other semiconductor materials including group III, group IV, and group V elements may also be used. The first active layer 101b may comprise a plurality of isolation features (not shown), such as shallow trench isolation (STI) features or local oxidation of silicon (LOCOS) features near an active side. The isolation features may define and isolate various microelectronic elements. The microelectronic elements may include transistors (e.g., MOSFET), complementary metal oxide semiconductor (CMOS) transistors, bipolar junction transistors (BJT), high voltage transistors, high frequency transistors, p-channel and/or n-channel field effect transistors (PFETs/NFETs), diodes, resistors, capacitors, inductors, or other suitable elements. Fabrication processes for these microelectronic elements 101c comprise deposition, etching, implantation, photolithography, annealing, or other suitable processes. These microelectronic elements are interconnected to form logic devices, memory devices (e.g., static random access memory or SRAM), radio frequency (RF) devices, input/output (I/O) devices, system-on-chip (SoC) devices, eFlash device, microelectromechanical (MEMS) devices, analog devices, CMOS devises, combinations of these, or the like. In one embodiment, the first semiconductor workpiece 101 may be a known good wafer ("KGW") or a known good die ("KGD") having known functional circuit units with the microelectronic elements 101c positioned in a grid fashion.

The first active layer 101b may be formed of passivation materials (e.g., oxide or dielectric) and may comprises metal interconnects in the passivation materials. In some embodiments, the microelectronic elements comprise metal pads for receiving and supplying electric signals to and from other metal interconnects (not shown).

In FIG. 1B, a second semiconductor workpiece 102 comprising a second substrate 102a and a second active layer 102b is bonded to the first semiconductor workpiece 101. The second active layer 102b comprising a plurality of microelectronic elements 102c. The bonding can be done by using fusion bonding, hybrid bonding, eutectic bonding, adhesive bonding, thermo-compression bonding, plasma activated bonding, or reactive bonding.

In FIG. 1B fusion bonding is adopted. The bonding process is described as follows. First, to avoid the occurrence of unbonded areas (i.e. interface bubbles), the to-be-bonded surfaces of the first semiconductor workpiece 101 and the second semiconductor workpiece 102 are processed to be sufficiently clean and smooth. In one embodiment, the to-be-bonded surfaces of the first semiconductor workpiece 101 and the second semiconductor workpiece 102 are processed (e.g., by polishing) to be smooth, with surface roughness less than 10 Angstroms or even less than 5 Angstroms. Then, the first semiconductor workpiece 101 and the second semiconductor workpiece 102 are aligned and placed in physical contact at room temperature with a predetermined amount of pressure to initiate a bonding process. An anneal at elevated temperatures is used to form the chemical bonds between the to-be-bonded surfaces of the first semiconductor workpiece 101 and the second semiconductor workpiece 102. In one embodiment, the annealing temperature is less than around 400 degree Celsius.

FIG. 1B also shows that the first active layer 101b of the first semiconductor workpiece 101 and the second active layer 102b of the second semiconductor workpiece 102 are arranged in a "face-to-face" bonding arrangement (i.e., semiconductor workpieces with their active layers bonded together). This embodiment is for illustrative purpose only and thus not limiting. Any arrangement of "face-to-face," "back-to-back," "face-to-back," or "back-to-face" combinations may be used in the bonding interface of the present disclosure.

In FIG. 1C, the second semiconductor workpiece 102 is thinned down to reduce the total thickness. Specifically, the thinning is performed by thinning down the second substrate 102a of the second semiconductor workpiece 102. The thinning can be done by mechanical grinding, chemical mechanical polishing (CMP), wet etching, atmospheric downstream plasma (ADP) dry chemical etching (DCE), a combination of aforementioned processes or any another appropriate thinning method(s). In one embodiment, the second semiconductor workpiece 102 is thinned down to be less than about 50 micron thick. In one embodiment, the second semiconductor workpiece 102 is thinned down to be less than about 10 micron thick.

In one embodiment, the second semiconductor workpiece 102 comprises a plurality of semiconductor dies (as shown in the embodiment of FIG. 1C, the second semiconductor workpiece 102 comprises two semiconductor dies). In FIG. 1D, the gaps between adjacent semiconductor dies of the second semiconductor workpiece 102 are filled with dielectric materials 105. In one embodiment, the dielectric material 105 is a molding compound such as epoxy resin or polyimide compound.

In FIG. 1E, openings 106 and 107 through the second semiconductor workpiece 102 are formed, wherein the opening 107 is formed through the dielectric material 105. The openings 106 and 107 in fact penetrate the second semiconductor workpiece 102 and extend to reach the first semiconductor workpiece 101. A hard mask layer and a patterned photoresist layer (both not shown) are formed on the second semiconductor workpiece 102 are used to define the openings 106 and 107. The hard mask layer may be a silicon nitride layer, a silicon oxynitride layer or the like. The photoresist layer is patterned by exposure, bake, developing, and/or other photolithography processes to provide openings exposing the hard mask layer. The exposed hard mask layer is then etched, by a wet etch or dry etch process, using the patterned photoresist layer as a masking element to provide openings. Using the hard mask layer and the patterned photoresist layer as mask elements, an etching process is performed to etching the exposed second semiconductor workpiece 102, forming the openings 106 and 107. After the formation of the openings 106 and 107, the hard mask layer and the photoresist layer are removed. The openings 106 and 107 may be etched using any suitable etching method including, for example, plasma etch, a chemical wet etch, a laser drill, and/or other processes known in the art. The etching process may result in an opening having a vertical sidewall profile or a tapered sidewall profile. In one embodiment, the openings 106 and 107 have a high aspect ratio between approximately 5 and approximately 10. In some embodiments, the aspect ratio of the openings 106 and 107 is greater than 10.

In FIG. 1F, a conductive material is deposited to fill the openings 106 and 107 to form electrically conductive vias 108 and 109, wherein the electrically conductive vias 109 are adjacent to the dielectric material 105'. The electrically conductive vias 108 and 109 serve to electrically connect the first active layer 101b of the first semiconductor workpiece 101 and the second active layer 102b of the second semiconductor workpiece 102 (e.g., by electrically connecting the microelectronic elements 101c and the microelectronic elements 102c). The conductive material may be formed of tungsten, tungsten-based alloy, copper, or copper-based alloy, aluminum, gold, silver, molybdenum (Mo), titanium nitride (TiN), and the like, formed through LPCVD, PECVD, MOCVD, ALD or other advance deposition technology (e.g., a copper-fill process includes metal seed layer deposition and copper electrochemical plating).

In some embodiments, a barrier layer (oxide liner) is optionally deposited before the formation of the electrically conductive vias 108 and 109. The barrier layer functions as a diffusion barrier to prevent metal diffusion and as an adhesion layer between metal and dielectric. Refractory metals, refractory metal-nitrides, refractory metal-silicon-nitrides and combinations thereof are typically used for the barrier layer. In one embodiment, the electrically conductive vias 108 are through silicon vias ("TSV") and the electrically conductive vias 109 are through dielectric vias ("TDV").

In FIG. 1G, metal pads 110 are formed to cover and electrically connect the electrically conductive vias 108 and 109. The metal pads 110 are utilized to electrically coupling external electrical contacts to one of the I/Os of the microelectronic elements 101c/102c. The metal pads 110 may comprise aluminum, copper or alloys thereof.

In FIG. 1H, a passivation layer 111 is formed over the second semiconductor workpiece 102 and on top of the metal pads 110 for structural support and physical isolation. The passivation layer 111 can protect the second semiconductor workpiece 102 from mechanical damage (particle/scratch/contamination) and other chemical corrosion. The passivation layer 111 may be made with silicon nitride (SiN), silicon dioxide (SiO2), silicon oxynitride (SiON), polyimide (PI), benzocyclobutene (BCB), polybenzoxazole (PBO), or other insulating material.

In FIG. 1I, a substrate 104 is bonded to the passivation layer 111 using glue material (not shown). The substrate 104 serves to provide mechanical support for the first semiconductor workpiece 101 and the second semiconductor workpiece 102 so as to facilitate further processing.

In FIG. 1J, the first semiconductor workpiece 101 is thinned down to reduce the total thickness. Specifically, the thinning is performed by thinning down the first substrate 101a of the first semiconductor workpiece 101. In one embodiment, the first semiconductor workpiece 101 is thinned down to be less than about 50 micron thick. In one embodiment, the first semiconductor workpiece 101 is thinned down to be less than about 10 micron thick.

In FIG. 1K, a bonding oxide layer 112 is formed on the thinned first substrate 101a of the first semiconductor workpiece 101 to facilitate further bonding process. In one embodiment, the bonding oxide layer 112 is formed by heating the surface of the first substrate 101a.

In FIG. 1L, a third semiconductor workpiece 103 comprising a third substrate 103a and a third active layer 103b is bonded to the bonding oxide layer 112 using fusion bonding techniques. The third active layer 103b comprises a plurality of microelectronic elements 103c. In one embodiment, the third semiconductor workpiece 103 comprises a plurality of semiconductor dies (two semiconductor dies as shown in FIG. 1L). In FIG. 1M, the gaps between adjacent semiconductor dies of the third semiconductor workpiece 103 are filled with dielectric materials 105.

In FIG. 1N, openings 113 and 114 through the third semiconductor workpiece 103 and the first semiconductor workpiece 101 are formed (wherein the opening 114 is formed through the dielectric material 105). The openings 113 and 114 may be formed using any suitable etching method including, for example, plasma etch, a chemical wet etch, a laser drill, and/or other processes known in the art. The etching process may result in an opening having a vertical sidewall profile or a tapered sidewall profile. In one embodiment, the openings 113 and 114 have a high aspect ratio between approximately 5 and approximately 10. In some embodiments, the aspect ratio of the openings 113 and 114 is greater than 10.

In FIG. 1O, a conductive material is deposited to fill the openings 113 and 114 to form electrically conductive vias 115 and 116, wherein the electrically conductive vias 116 are adjacent to the dielectric material 105'. The electrically conductive vias 115 and 116 serve to electrically connect the first active layer 101b of the first semiconductor workpiece 101 and the third active layer 103b of the third semiconductor workpiece 103 (by electrically connecting the microelectronic elements 101c and the microelectronic elements 103c). The conductive material may be formed of tungsten, tungsten-based alloy, copper, or copper-based alloy, aluminum, gold, silver, molybdenum (Mo), titanium nitride (TiN), and the like, formed through LPCVD, PECVD, MOCVD, ALD or other advance deposition technology. In some embodiments, a barrier layer (oxide liner) is optionally deposited before the formation of the electrically conductive vias 115 and 116. In one embodiment, the electrically conductive vias 115 are through silicon vias ("TSV") and the electrically conductive vias 116 are through dielectric vias ("TDV").

In FIG. 1P, metal pads 117 are formed to cover and electrically connect the electrically conductive vias 115 and 116. The metal pads 117 are utilized to electrically coupling external electrical contacts to one of the I/Os of the microelectronic elements 101c/102c/103c. The metal pads 117 may comprise aluminum, copper or alloys thereof.

In FIG. 1Q, a passivation layer 118 is formed over the third semiconductor workpiece 103 and on top of the metal pads 117 for structural support and physical isolation. The passivation layer 118 can protect the second semiconductor workpiece 103 from mechanical damage (particle/scratch/contamination) and other chemical corrosion.

In FIG. 1R, the passivation layer 118 is patterned to include openings so as to expose the metal pads 117. Conductive bumps 119 are formed on the exposed portion of the metal pads 117. In FIG. 1R, the substrate 104 is de-bonded from the passivation layer 111. FIG. 1R shows a semiconductor structure manufactured in accordance with the first method embodiment of the present disclosure, wherein the electrically conductive vias 108 and 109 and the electrically conductive vias 115 and 116 are formed to taper toward opposite directions. In one embodiment, the first semiconductor workpiece 101 is a known good wafer ("KGW") and a further dicing is carried out on the semiconductor structure of FIG. 1R to yield a plurality of sub-structures (not shown). In one embodiment, the metal pads 110 are further exposed from beneath the passivation layer 111 using any suitable etching method such that the metal pads 110 may be connected to external electrical contacts (not shown).

Figure 2A:
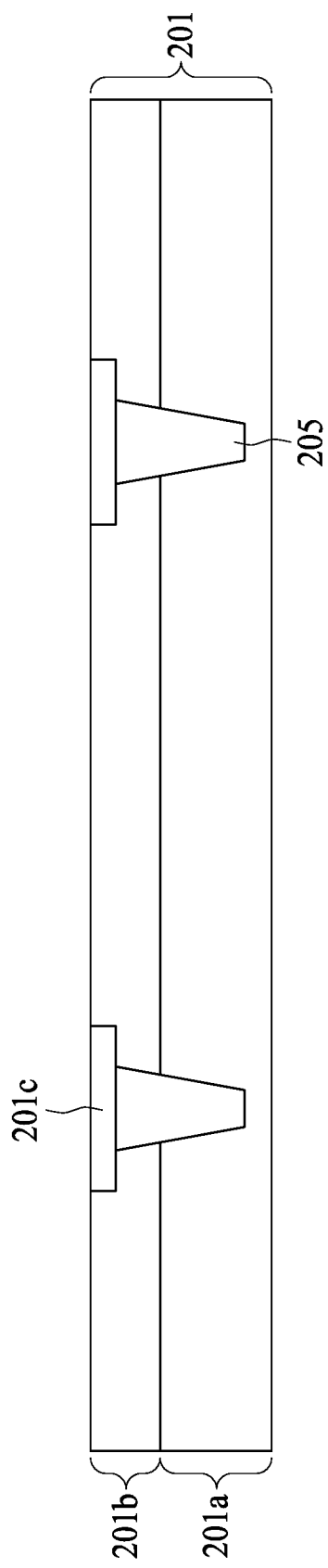
FIGS. 2A-2P schematically illustrate a method of manufacturing a semiconductor structure in accordance with one embodiment of the present disclosure.
Figure 2B:
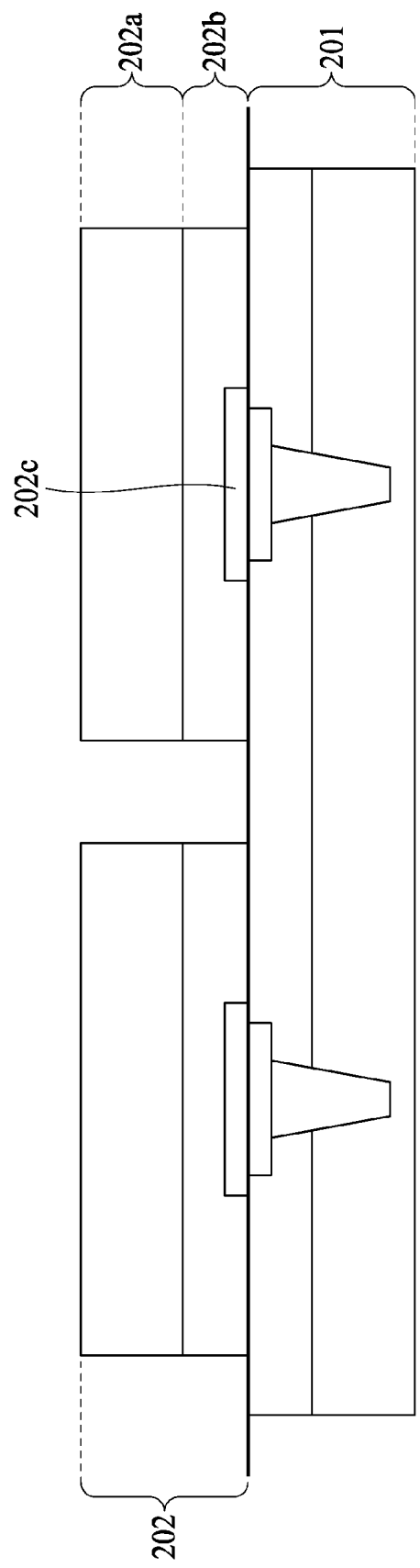
Figure 2C:
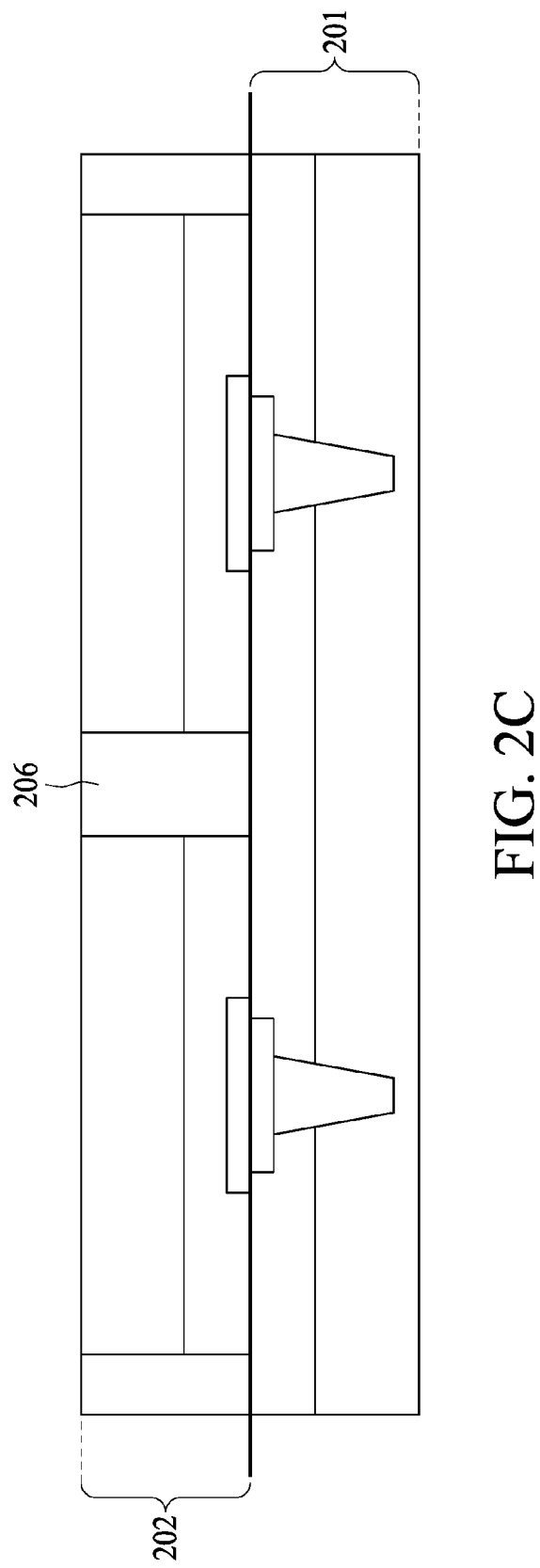
Figure 2D:
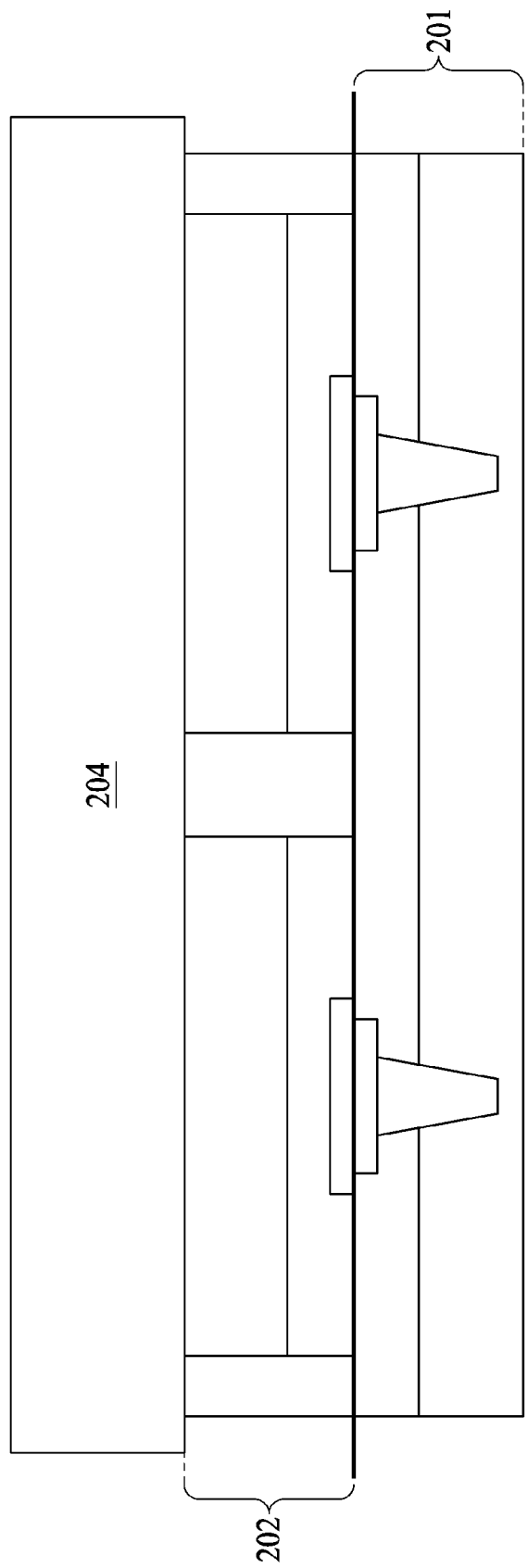
Figure 2E:
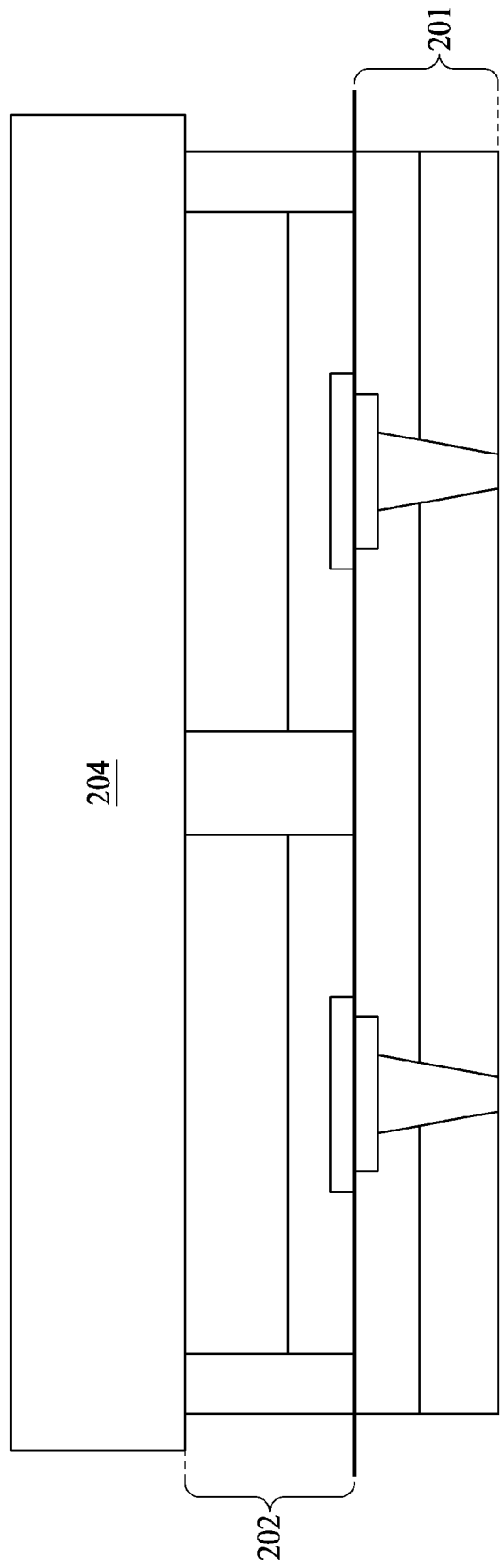
Figure 2F:
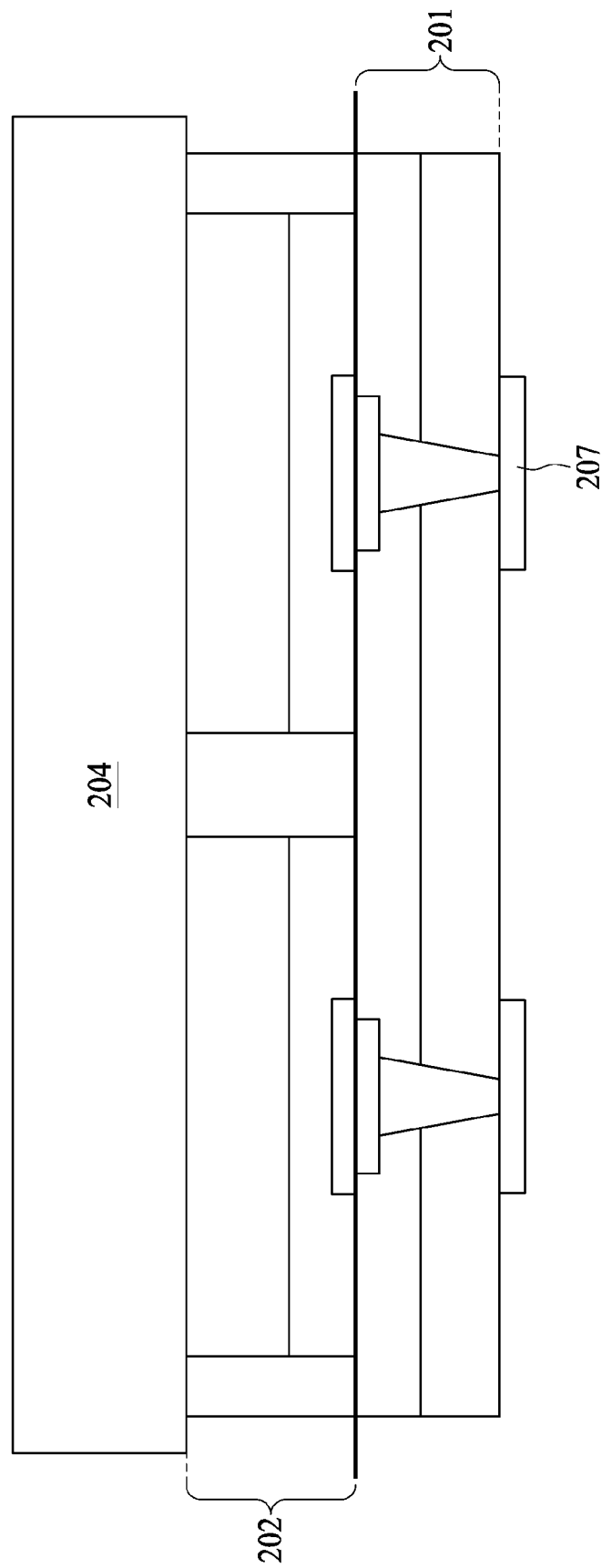
Figure 2G:
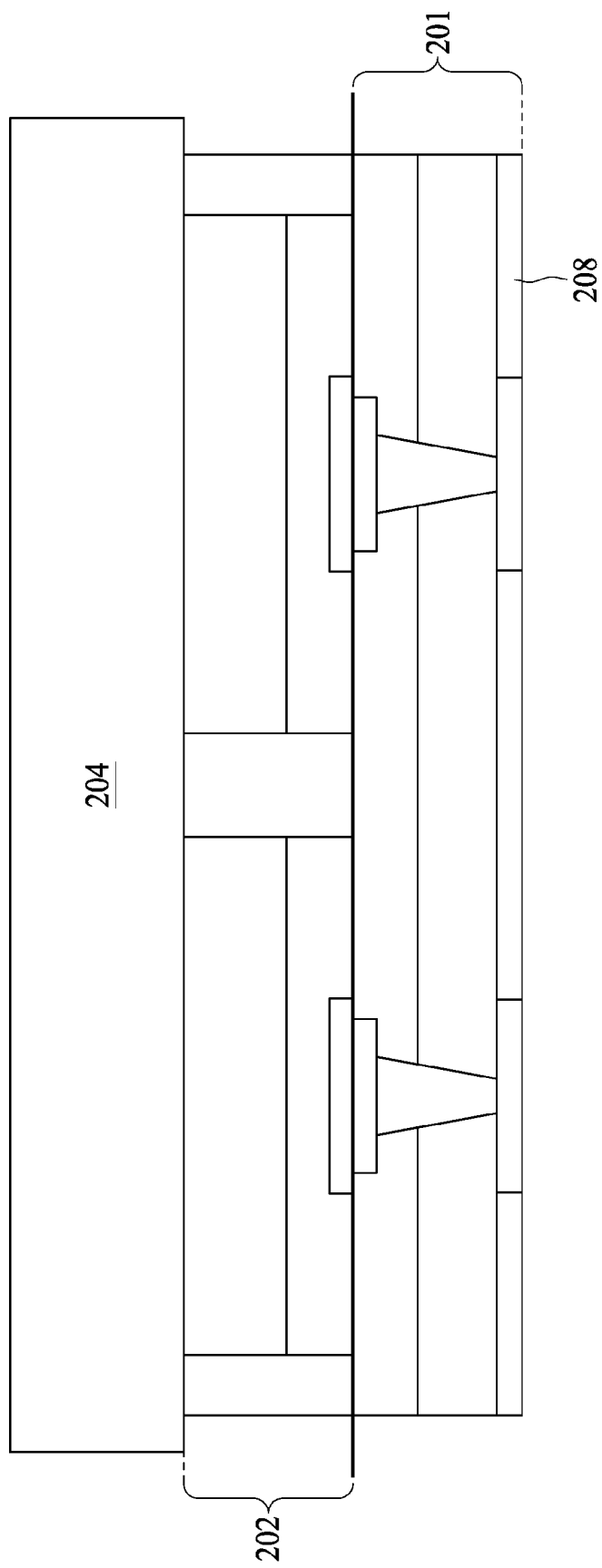
Figure 2H:
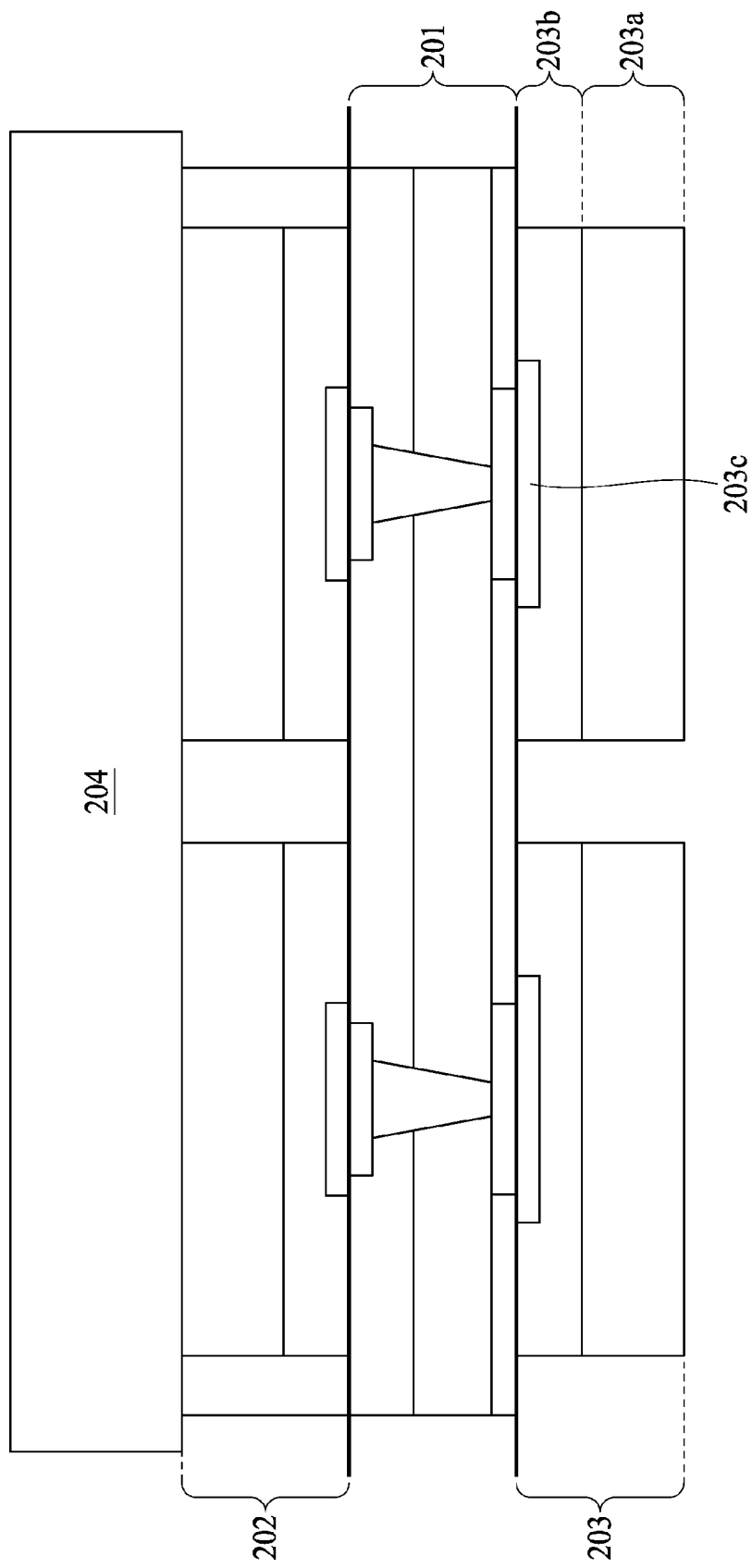
Figure 2I:
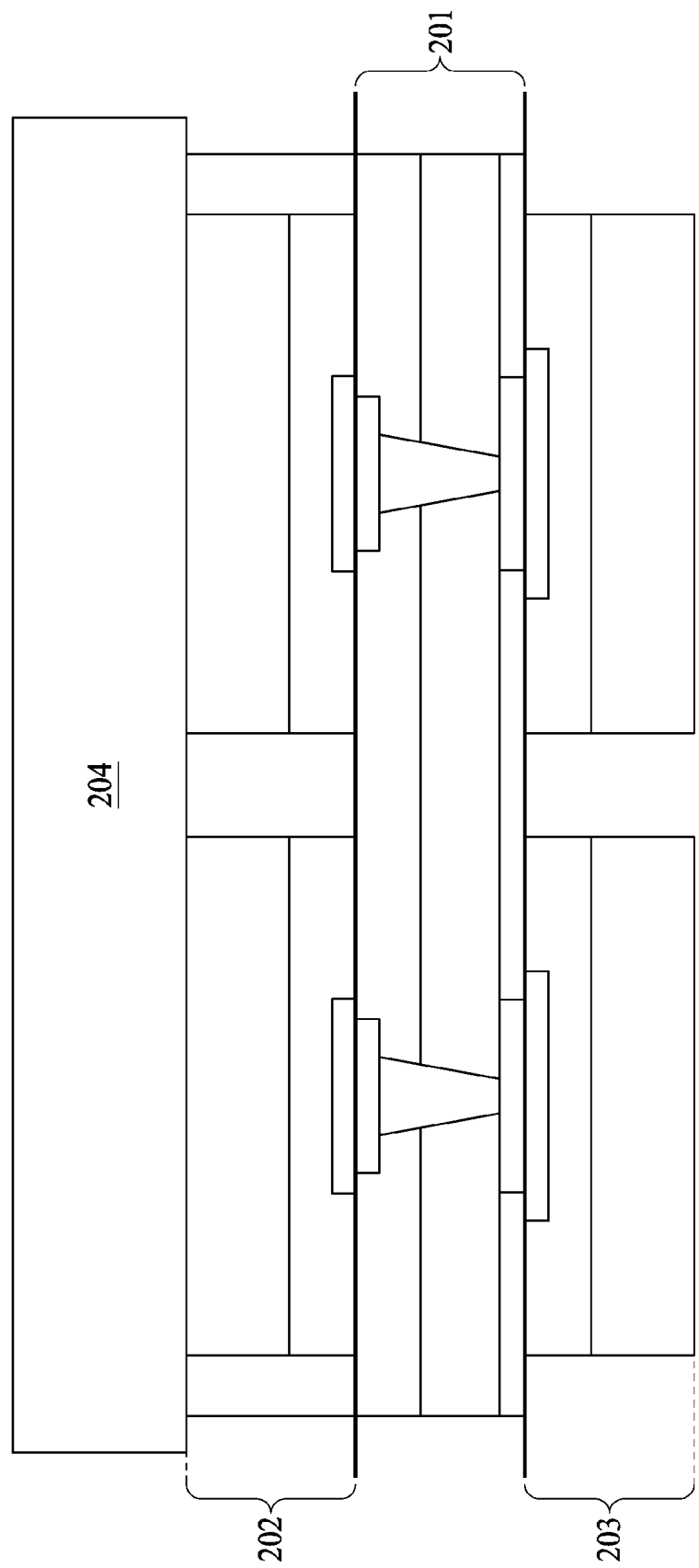
Figure 2J:
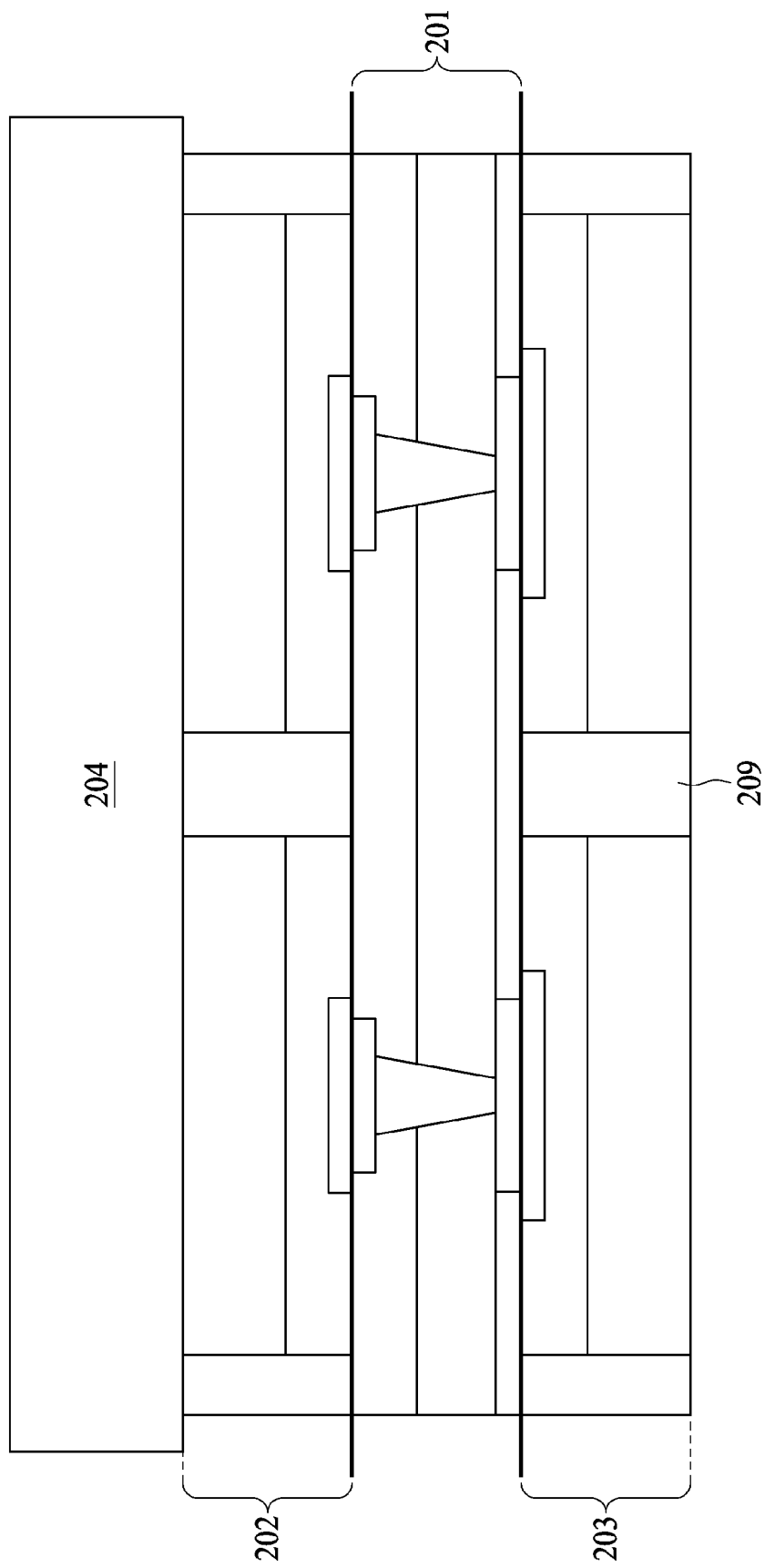
Figure 2K:
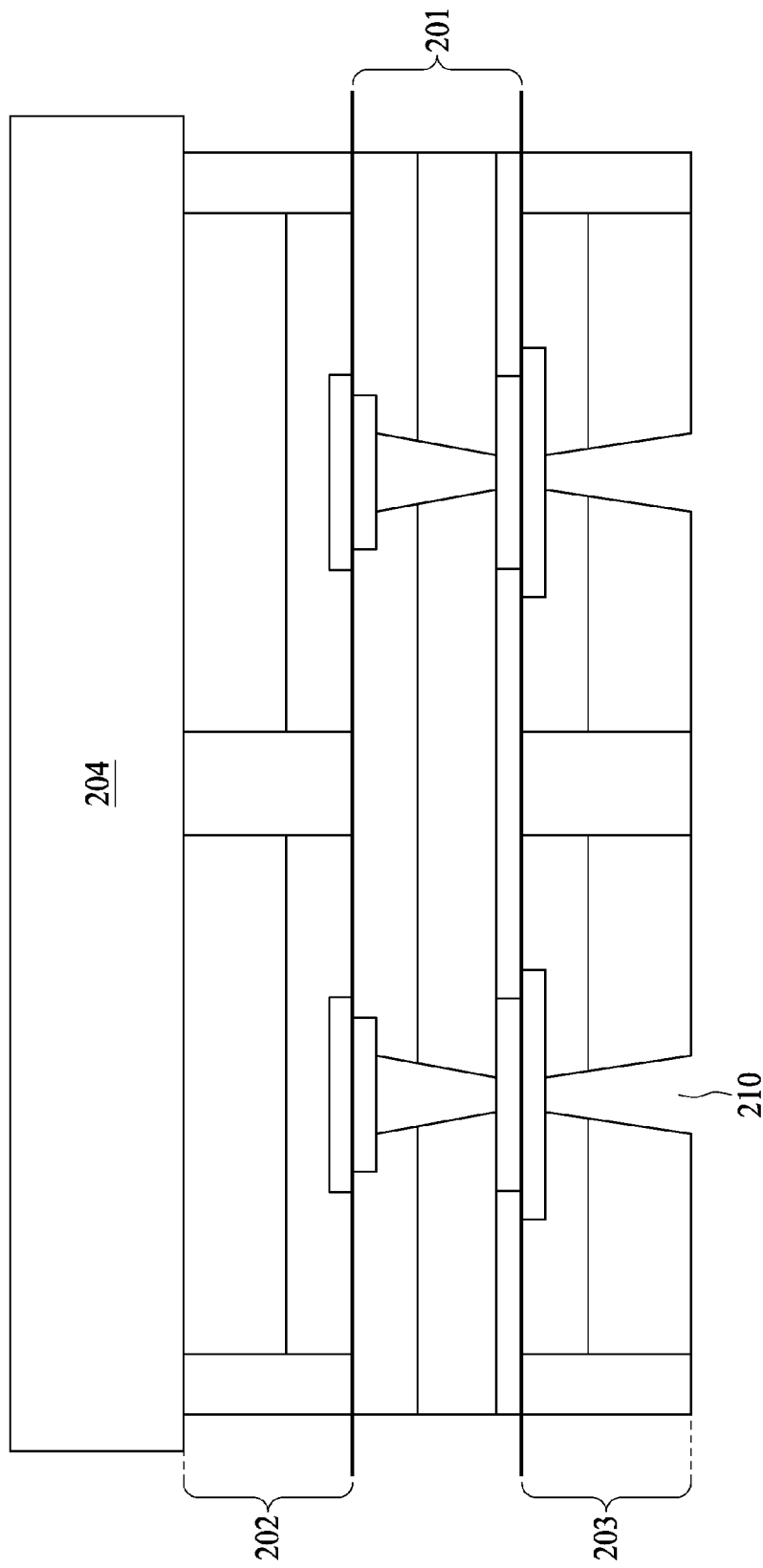
Figure 2L:
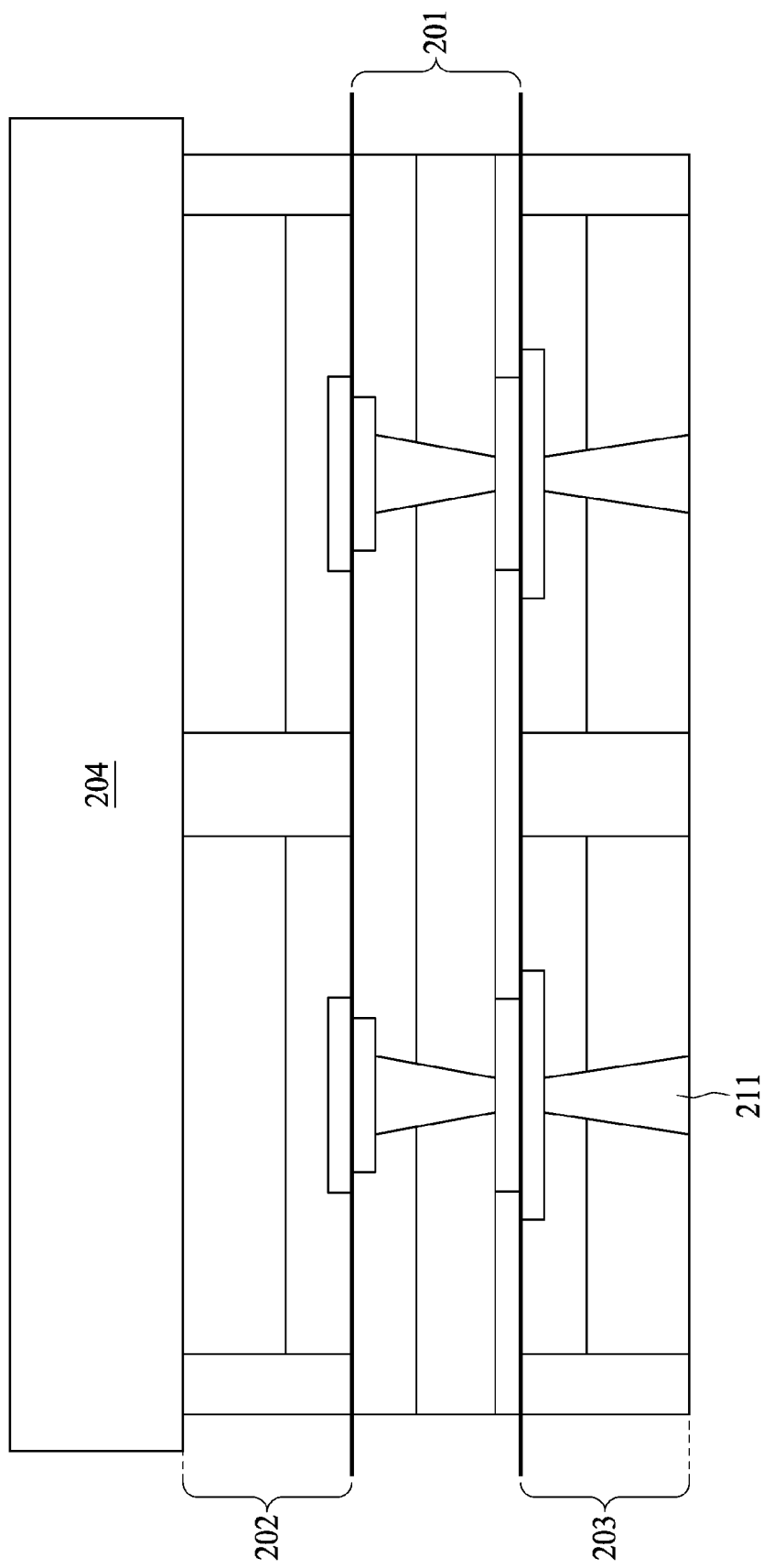
Figure 2M:
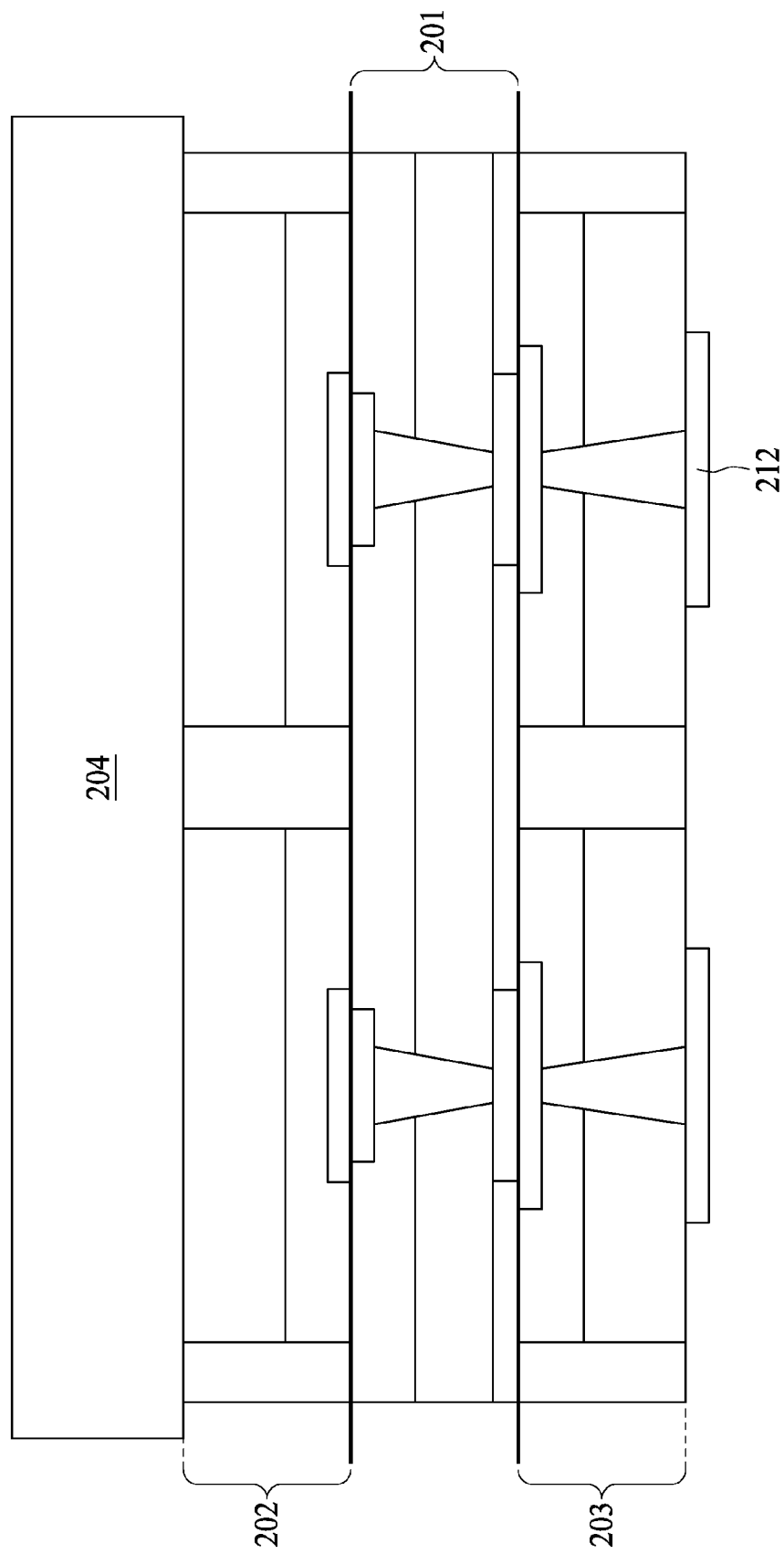
Figure 2N:
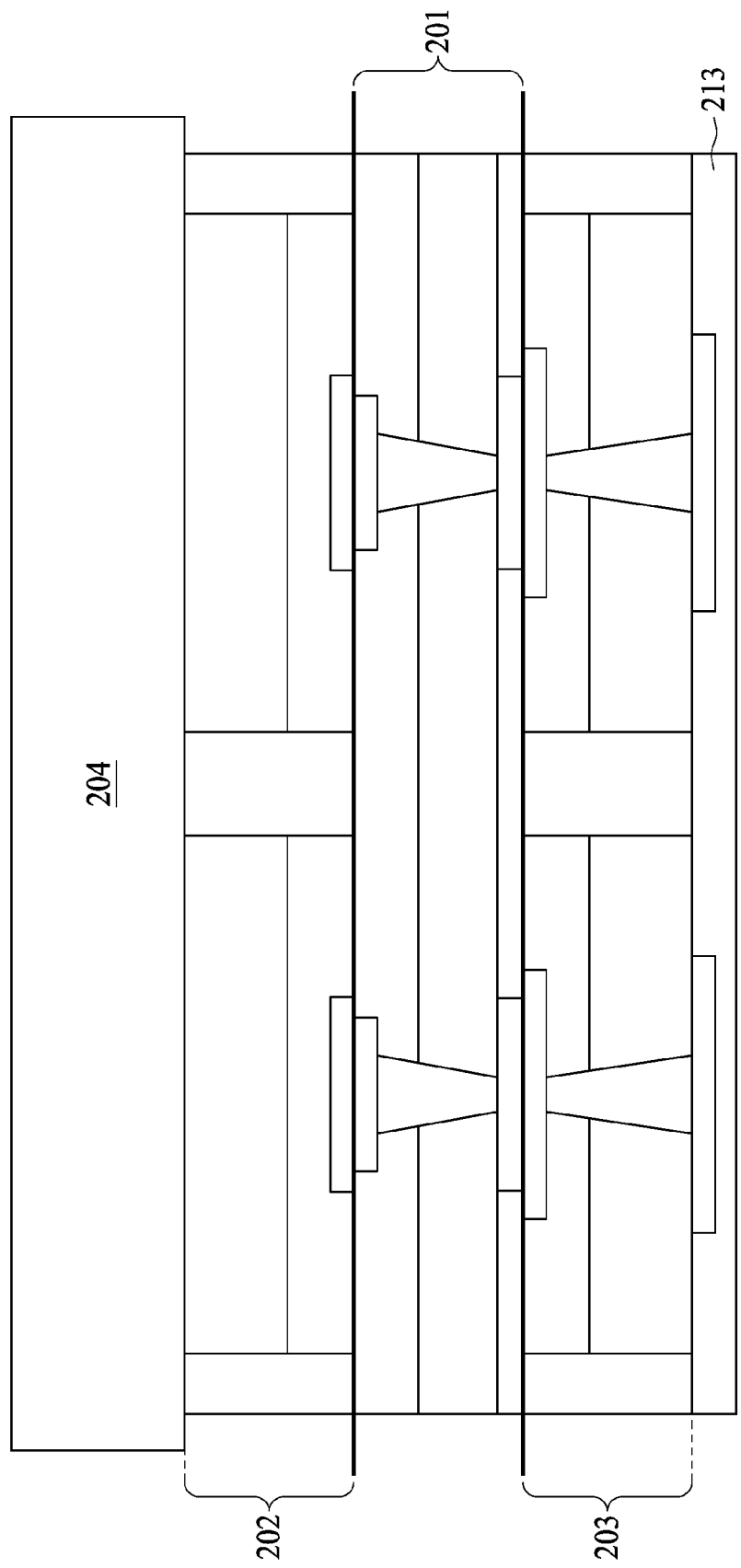
Figure 2O:
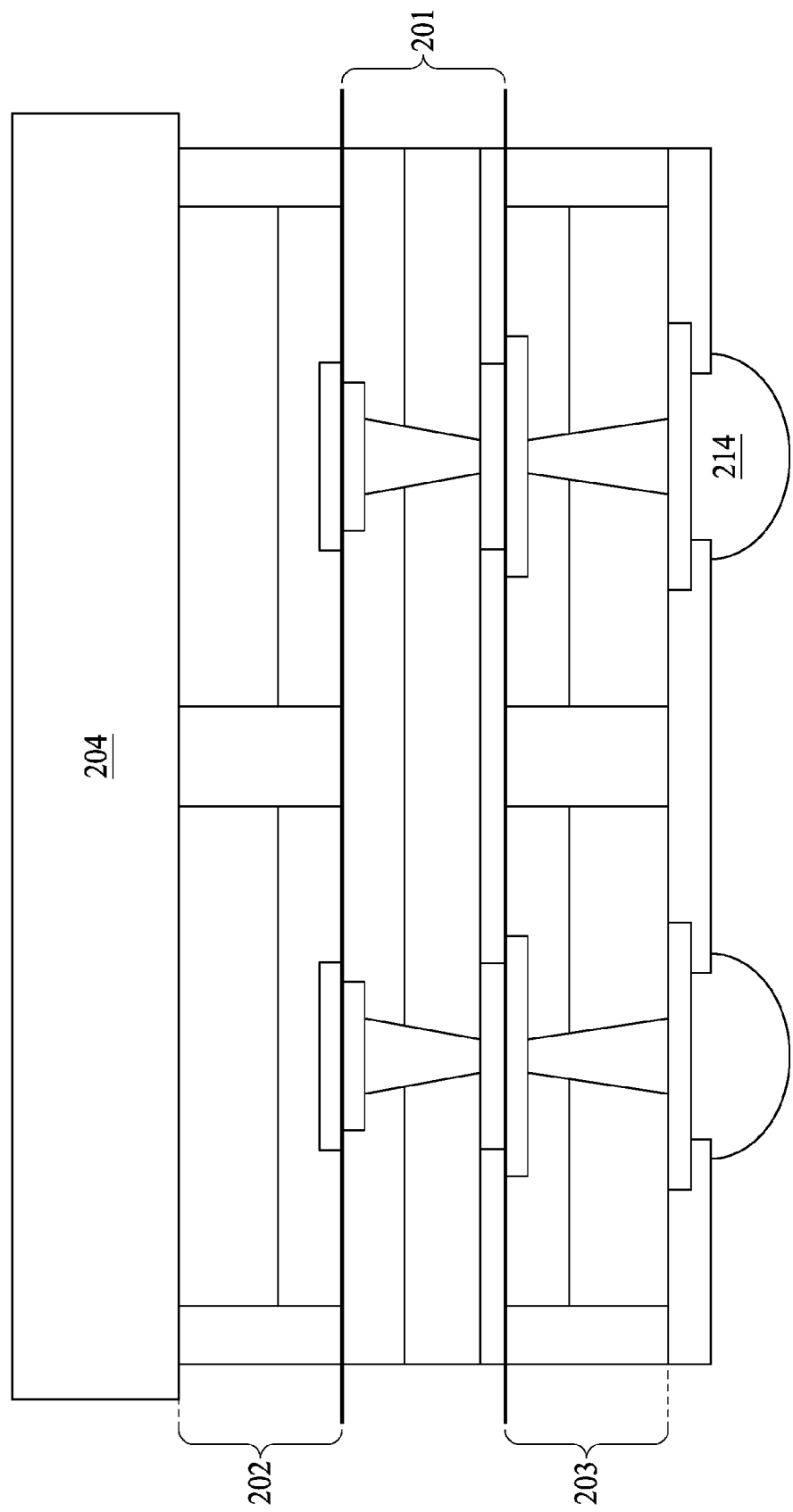
Figure 2P:
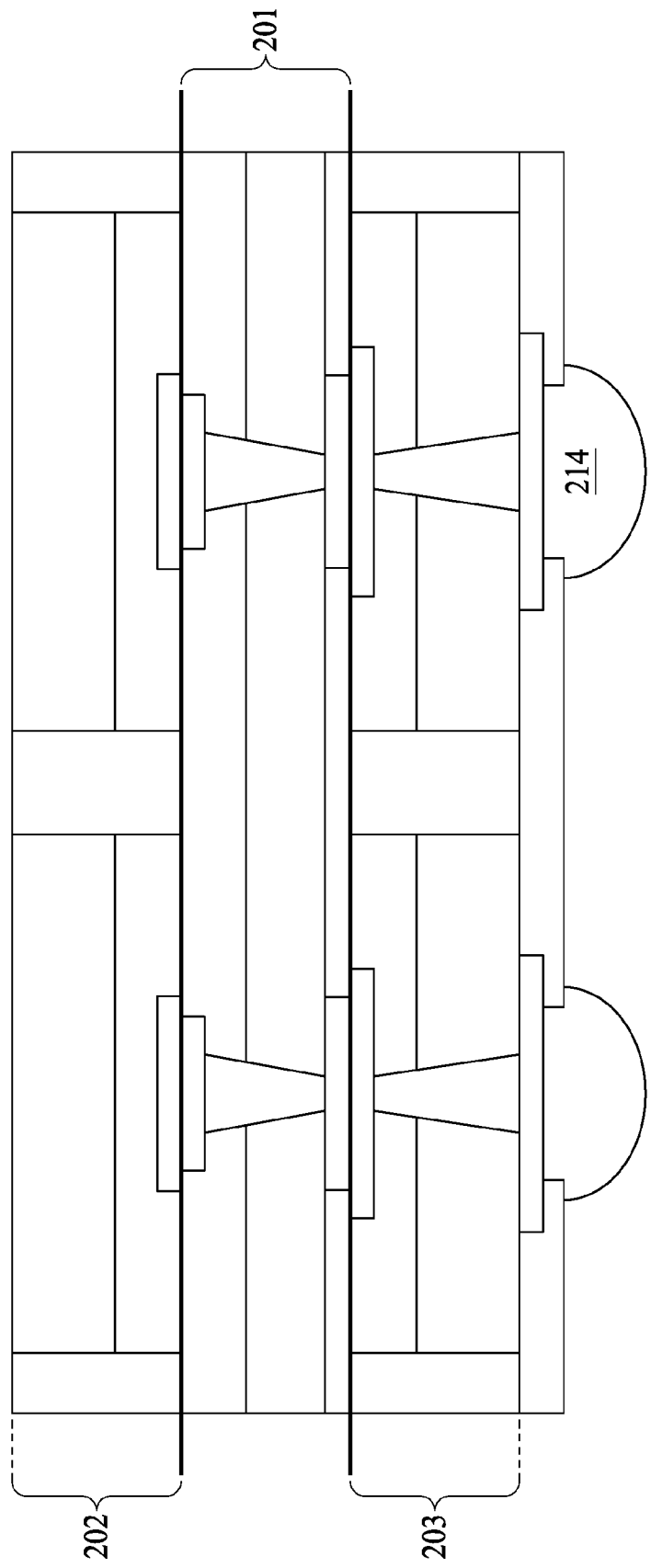

In reference to the drawings, FIGS. 2A-2P schematically illustrate operations for manufacturing a semiconductor structure in accordance with a second embodiment of the present disclosure.

In FIG. 2A, a first semiconductor workpiece 201 is provided. The first semiconductor workpiece 201 may comprise a first substrate 201a and a first active layer 201b. The first active layer 201b may be formed of the same material as the first substrate 101a. Alternatively, the first active layer 201b may be formed of passivation materials (e.g., oxide or dielectric). The first active layer 201b may comprise a plurality of microelectronic elements (not shown).

As shown in FIG. 2A, the first semiconductor workpiece 201 comprises electrically conductive vias 205 embedded therein. Additionally, the first active layer 201b comprises metal pads 201c. In one embodiment, the first semiconductor workpiece 201 is a known good wafer ("KGW").

In FIG. 2B, a second semiconductor workpiece 202 comprising a second substrate 202a and a second active layer 202b is bonded to the first semiconductor workpiece 201. The second active layer 202b comprises a plurality of microelectronic elements (not shown) and metal pads 202c. As shown in FIG. 2B, the second semiconductor workpiece 202 is bonded to the first semiconductor workpiece 201 by hybrid bonding. In hybrid bonding, dielectric material is bonded in a manner similar to fusion bonding, and metal pads are bonded using an anneal process. In one embodiment, the metal pads 201c and metal pads 202c are oxidized to form a metal oxide, the metal oxides are etched from the metal pads, forming metal pads with well controlled surface profiles, and the semiconductor workpieces are first bonded with a contact bond, and then subjected to a relatively low temperature anneal to form metal pad to metal pad bonds. Both dielectric surfaces and metal pads bond in the hybrid bonding process.

In FIG. 2C, the second semiconductor workpiece 202 comprises a plurality of semiconductor dies and the gaps between adjacent semiconductor dies of the second semiconductor workpiece 202 are filled with dielectric materials 206.

In FIG. 2D, a substrate 204 is bonded to the second semiconductor workpiece 202. The substrate serves to provide mechanical support for the first semiconductor workpiece 101 and the second semiconductor workpiece 202 so as to facilitate further processing.

In FIG. 2E, the first semiconductor workpiece 201 is thinned down to reduce the total thickness and to reveal (expose) the electrically conductive vias 205. Specifically, the thinning is performed by thinning down the first substrate 201a of the first semiconductor workpiece 201.

In FIG. 2F, metal pads 207 are formed to cover and electrically connect the electrically conductive vias 205. The metal pads 207 may comprise aluminum, copper or alloys thereof.

In FIG. 2G, a passivation layer 208 is formed over the first semiconductor workpiece 201 and on top of the metal pads 207 for structural support and physical isolation. The passivation layer 208 can protect the first semiconductor workpiece 201 from mechanical damage (particle/scratch/contamination) and other chemical corrosion.

In FIG. 2H, a third semiconductor workpiece 203 comprising a third substrate 203a and a third active layer 203b is bonded to the first semiconductor workpiece 201 using hybrid bonding techniques. The third active layer 103b comprises a plurality of microelectronic elements (not shown) and metal pads 203c. In hybrid bonding, dielectric material is bonded in a manner similar to fusion bonding, and metal pads are bonded using an anneal process. In one embodiment, the metal pads 201c and metal pads 203c are subjected to a relatively low temperature anneal to form metal pad to metal pad bonds.

In FIG. 2I, the third semiconductor workpiece 203 is thinned down to reduce the total thickness (by thinning down the third substrate 203a). In one embodiment, the third semiconductor workpiece 203 is thinned down to be less than about 50 micron thick. In one embodiment, the third semiconductor workpiece 203 is thinned down to be less than about 10 micron thick.

In one embodiment, the third semiconductor workpiece 203 comprises a plurality of semiconductor dies (two semiconductor dies as shown in FIG. 2J). In FIG. 2J, the gaps between adjacent semiconductor dies of the third semiconductor workpiece 203 are filled with dielectric materials 209.

In FIG. 2K, openings 210 through the third semiconductor workpiece 203 are formed. The openings 210 in fact penetrate the third semiconductor workpiece 203 and extend to reach the first semiconductor workpiece 201. The etching process may result in an opening having a vertical sidewall profile or a tapered sidewall profile. In embodiment, the openings 210 have a high aspect ratio between approximately 5 and approximately 10. In some embodiments, the aspect ratio of the openings 210 is greater than 10.

In FIG. 2L, a conductive material is deposited to fill the openings 210 to form electrically conductive vias 211. In one embodiment, the electrically conductive vias 211 are through silicon vias ("TSV").

In FIG. 2M, metal pads 212 are formed to cover and electrically connect the electrically conductive vias 211. The metal pads 212 may comprise aluminum, copper or alloys thereof.

In FIG. 2N, a passivation layer 213 is formed over the third semiconductor workpiece 203 and on top of the metal pads 212 for structural support and physical isolation.

In FIG. 2O, the passivation layer 213 is patterned to include openings so as to expose the metal pads 212. Conductive bumps 214 are formed on the exposed portion of the metal pads 212.

In FIG. 2P, the substrate 204 is de-bonded from the second semiconductor workpiece 202. FIG. 2P shows a semiconductor structure manufactured in accordance with the second method embodiment of the present disclosure, wherein the electrically conductive vias 205 and 211 are formed to taper toward opposite directions In reference to the drawings, FIGS. 3A-3O schematically illustrate operations for manufacturing a semiconductor structure in accordance with a third embodiment of the present disclosure.

Figure 3A:
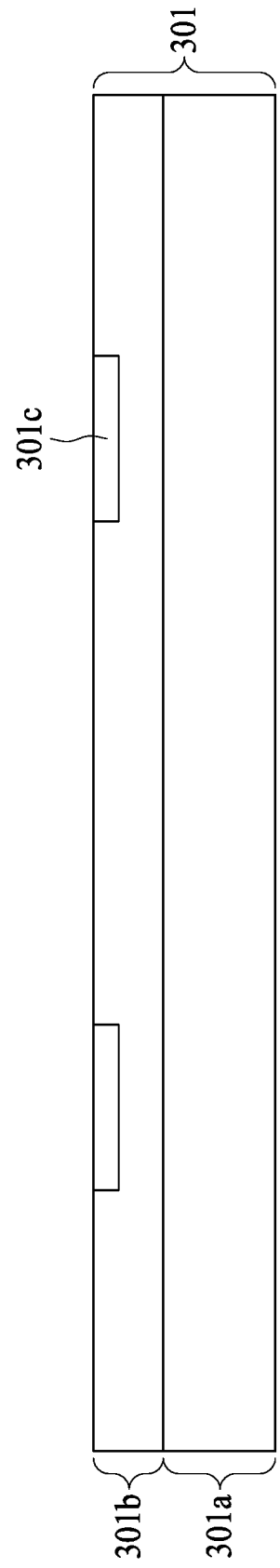
FIGS. 3A-3O schematically illustrate a method of manufacturing a semiconductor structure in accordance with one embodiment of the present disclosure.

In FIG. 3A, a first semiconductor workpiece 301 is provided. The first semiconductor workpiece 301 may comprise a first substrate 301a and a first active layer 301b. The first active layer 301b comprises a plurality of microelectronic elements (not shown) and metal pads 301c. In one embodiment, the first semiconductor workpiece 301 is a known good wafer ("KGW").

Figure 3B:
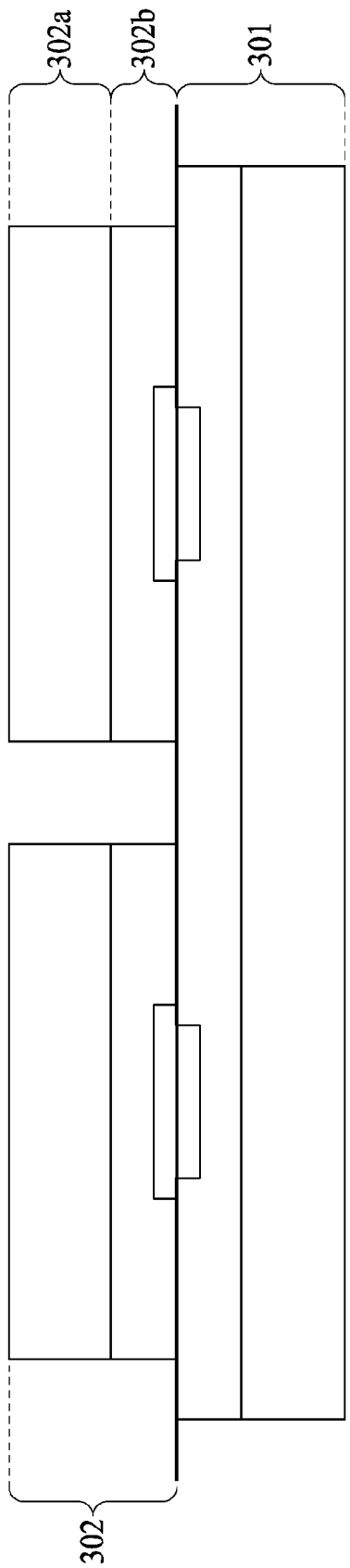

In FIG. 3B, a second semiconductor workpiece 302 comprising a second substrate 302a and a second active layer 302b is bonded to the first semiconductor workpiece 301. The second active layer 302b comprises a plurality of microelectronic elements (not shown) and metal pads 302c. As shown in FIG. 3B, the second semiconductor workpiece 302 is bonded to the first semiconductor workpiece 301 by hybrid bonding.

Figure 3C:
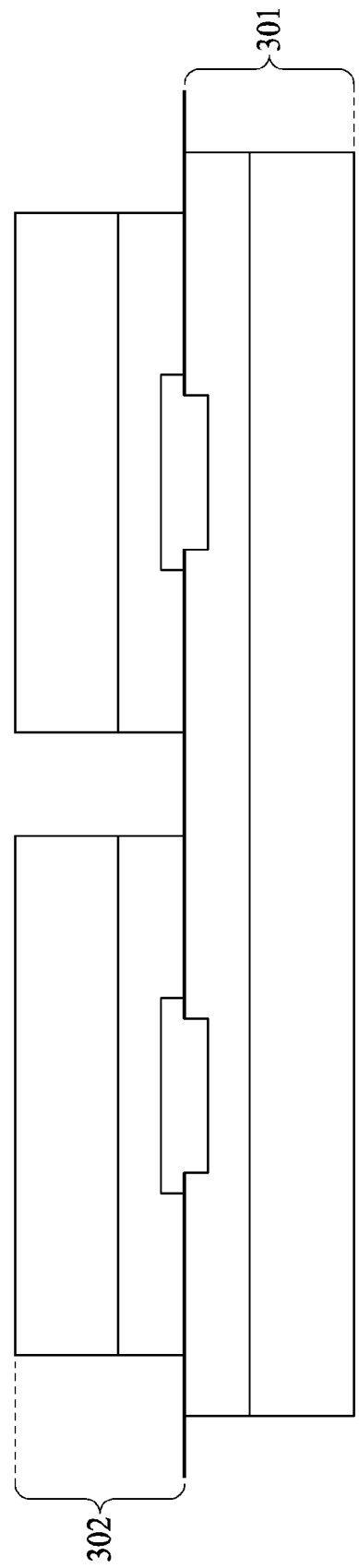

In FIG. 3C, the second semiconductor workpiece 302 is thinned down to reduce the total thickness (by thinning down the second substrate 302a of the second semiconductor workpiece 302).

Figure 3D:
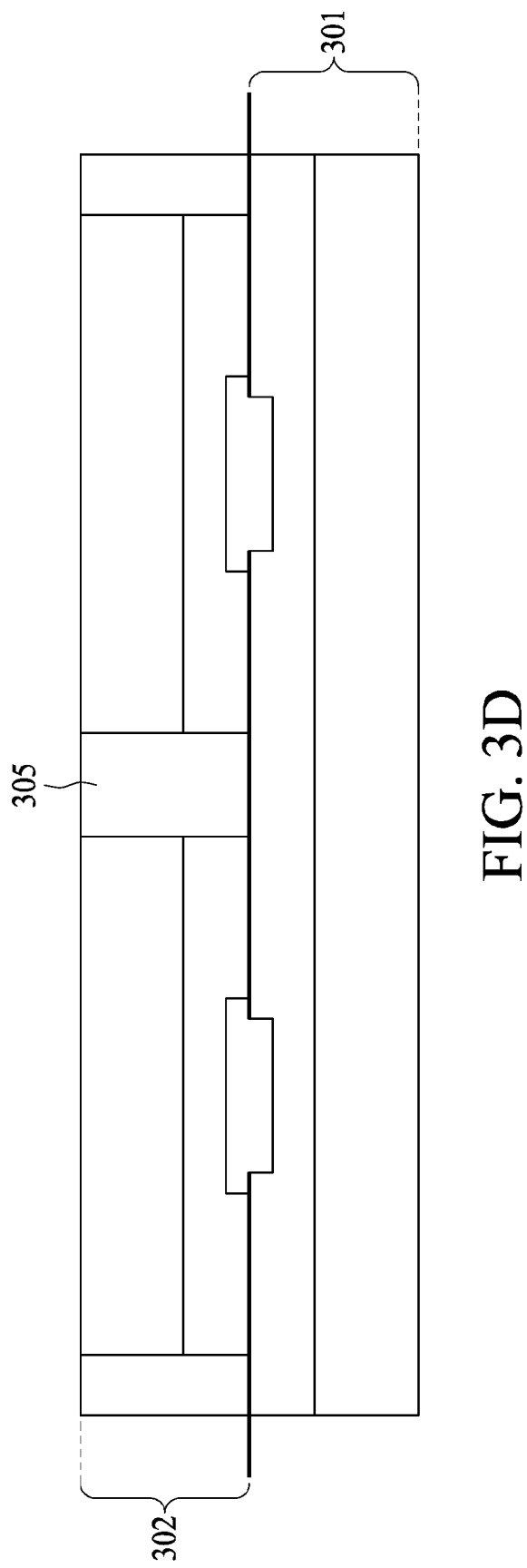

In FIG. 3D, the second semiconductor workpiece 302 comprises a plurality of semiconductor dies and the gaps between adjacent semiconductor dies of the second semiconductor workpiece 302 are filled with dielectric materials 305.

Figure 3E:
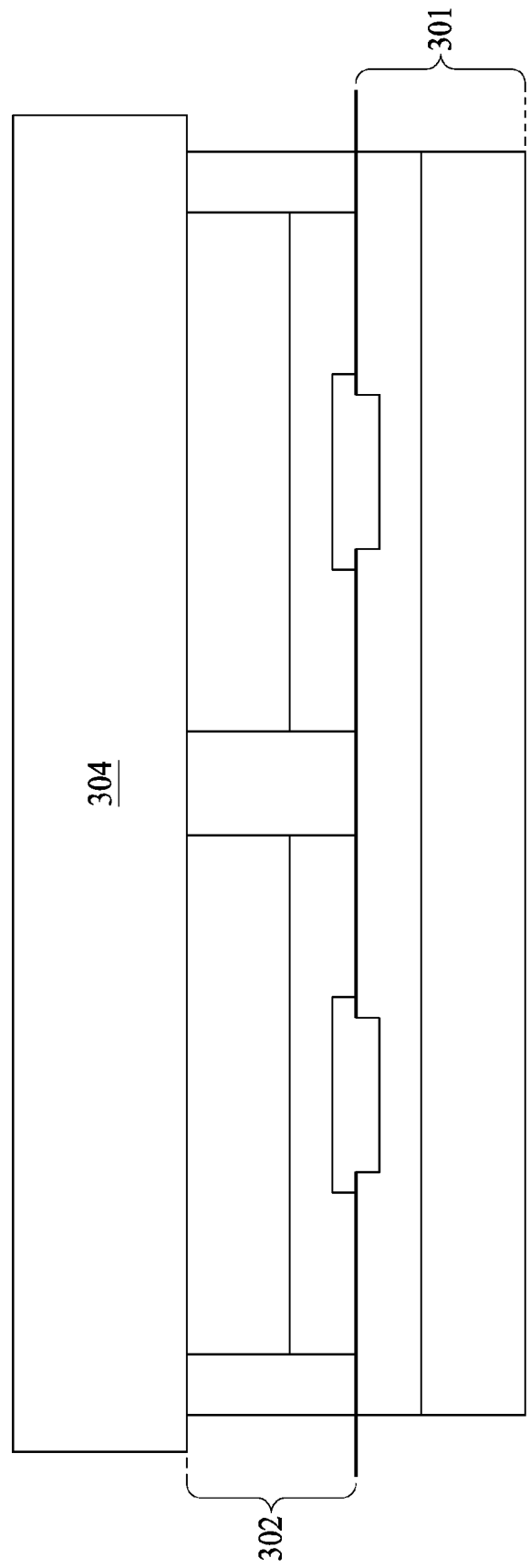

In FIG. 3E, a substrate 304 is bonded to the second semiconductor workpiece 302. The substrate serves to provide mechanical support for the first semiconductor workpiece 301 and the second semiconductor workpiece 302 so as to facilitate further processing.

Figure 3F:
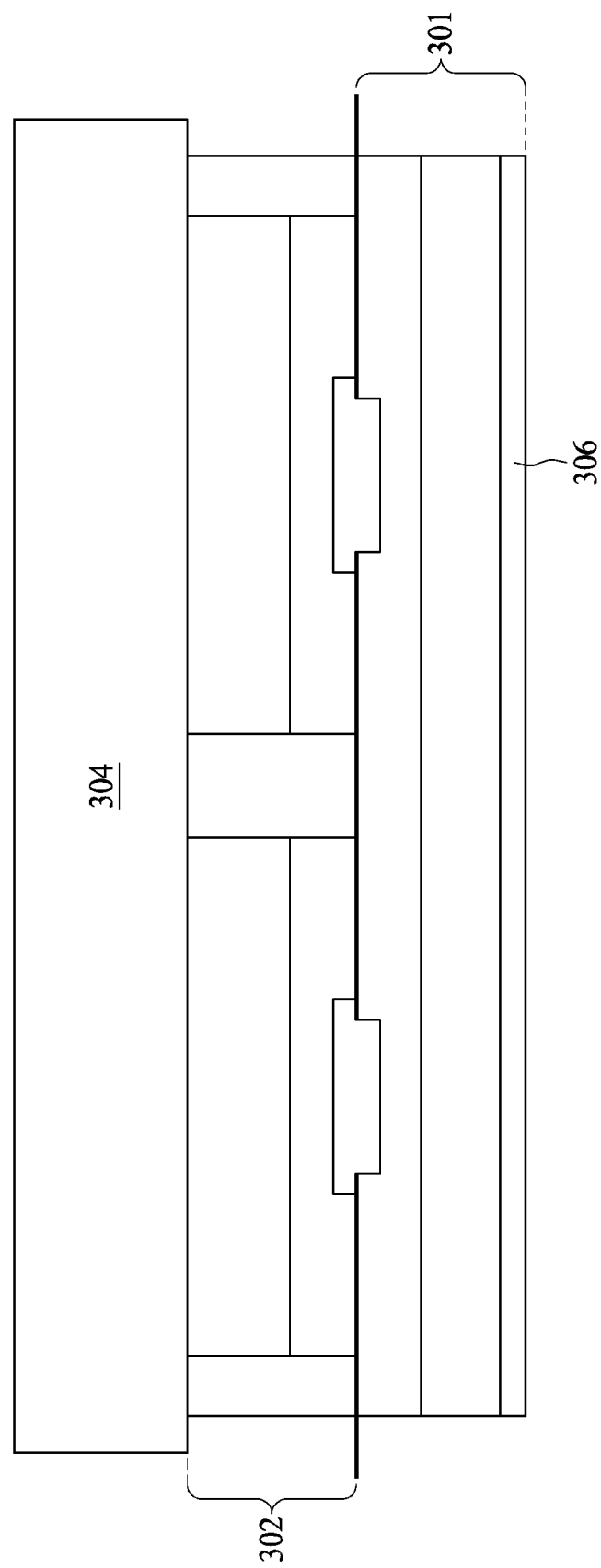

In FIG. 3F, a bonding oxide layer 306 is formed on the first semiconductor workpiece 301 to facilitate further bonding process.

Figure 3G:
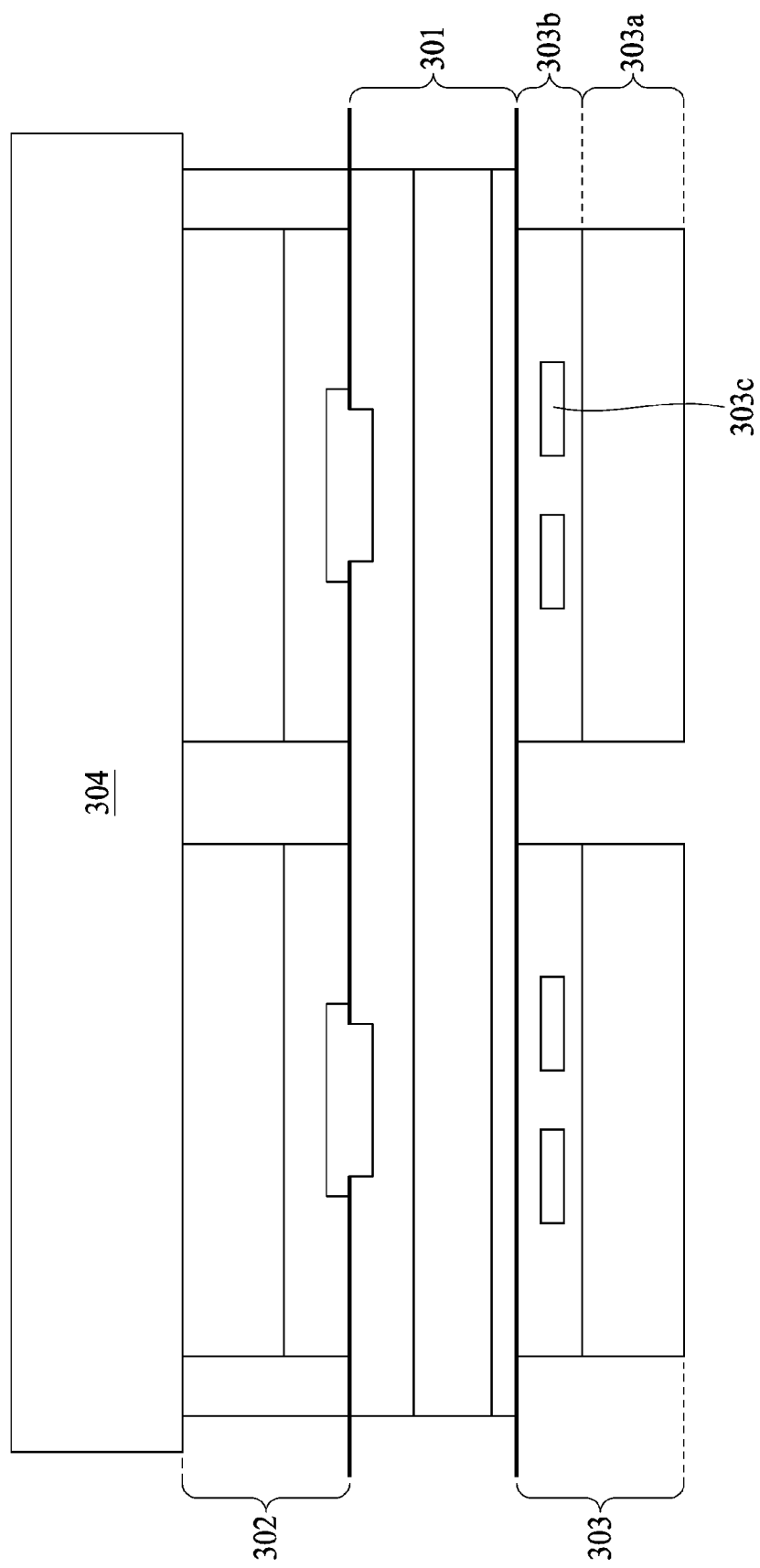

In FIG. 3G, a third semiconductor workpiece 303 comprising a third substrate 303a and a third active layer 303b is bonded to the bonding oxide layer 306 using fusion bonding techniques. The third active layer 303b comprises a plurality of microelectronic elements 303c.

Figure 3H:
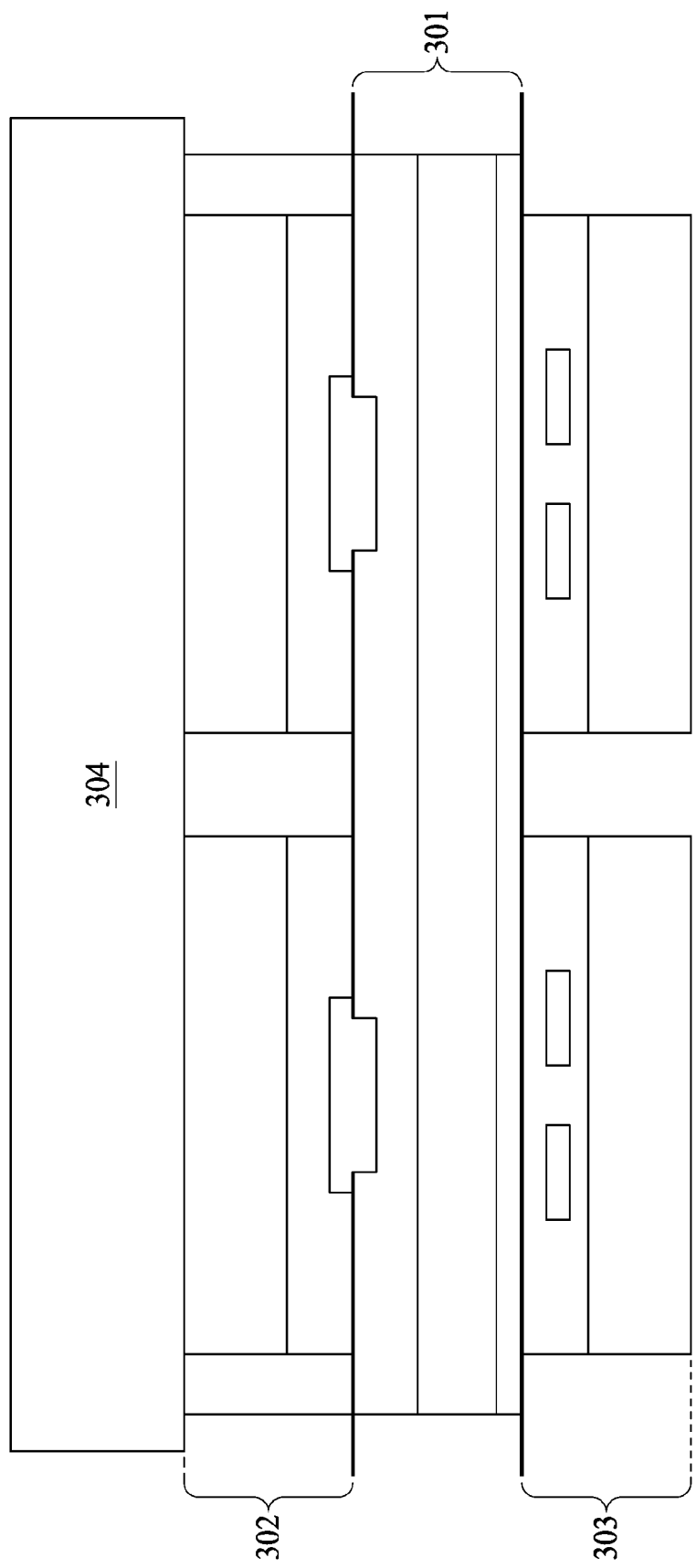

In FIG. 3H, the third semiconductor workpiece 303 is thinned down to reduce the total thickness. In one embodiment, the third semiconductor workpiece 303 is thinned down to be less than about 50 micron thick. In one embodiment, the third semiconductor workpiece 303 is thinned down to be less than about 10 micron thick.

Figure 3I:
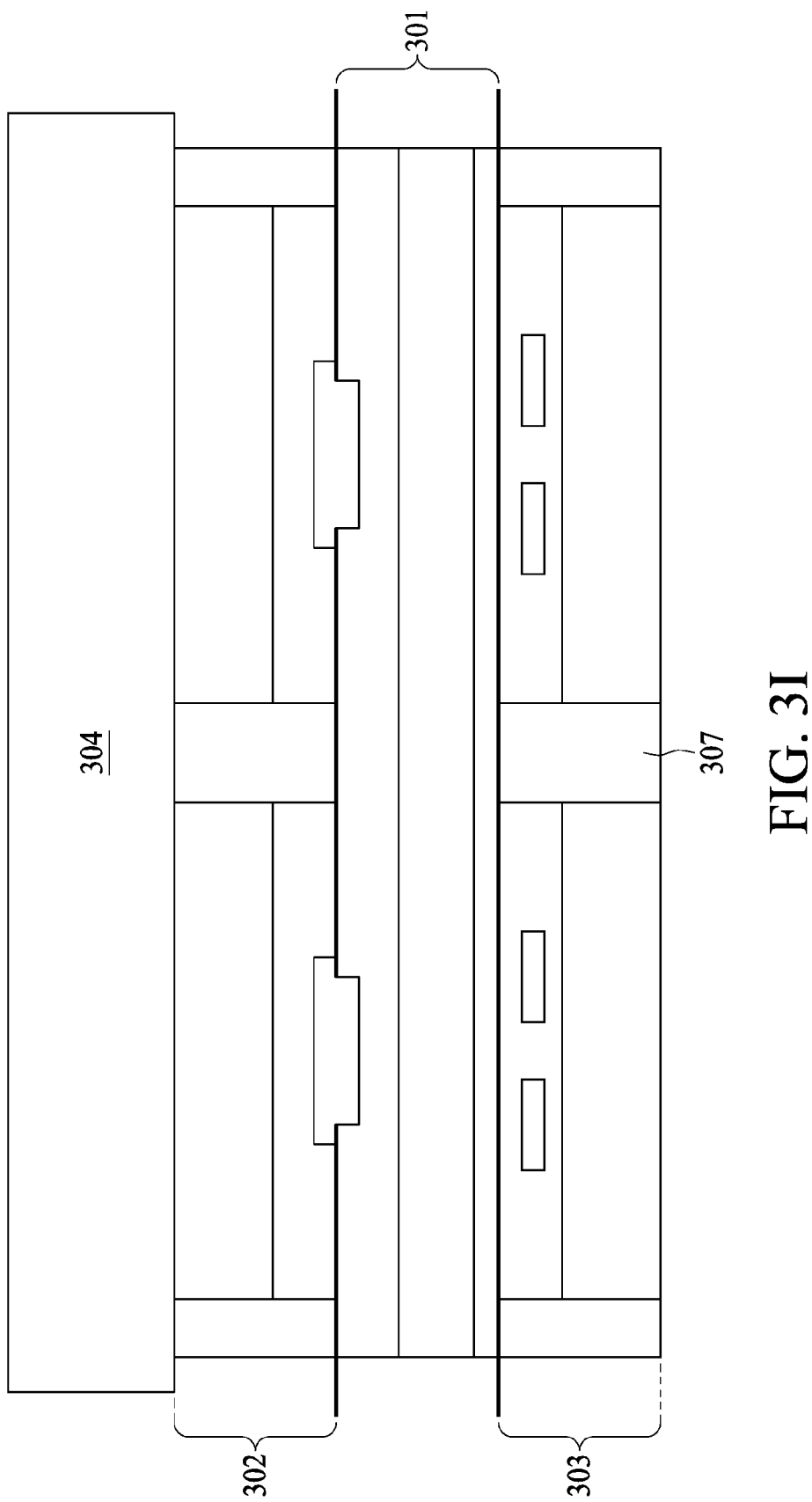

In one embodiment, the third semiconductor workpiece 303 comprises a plurality of semiconductor dies (two semiconductor dies as shown in FIG. 3I). In FIG. 3I, the gaps between adjacent semiconductor dies of the third semiconductor workpiece 303 are filled with dielectric materials 307.

Figure 3J:
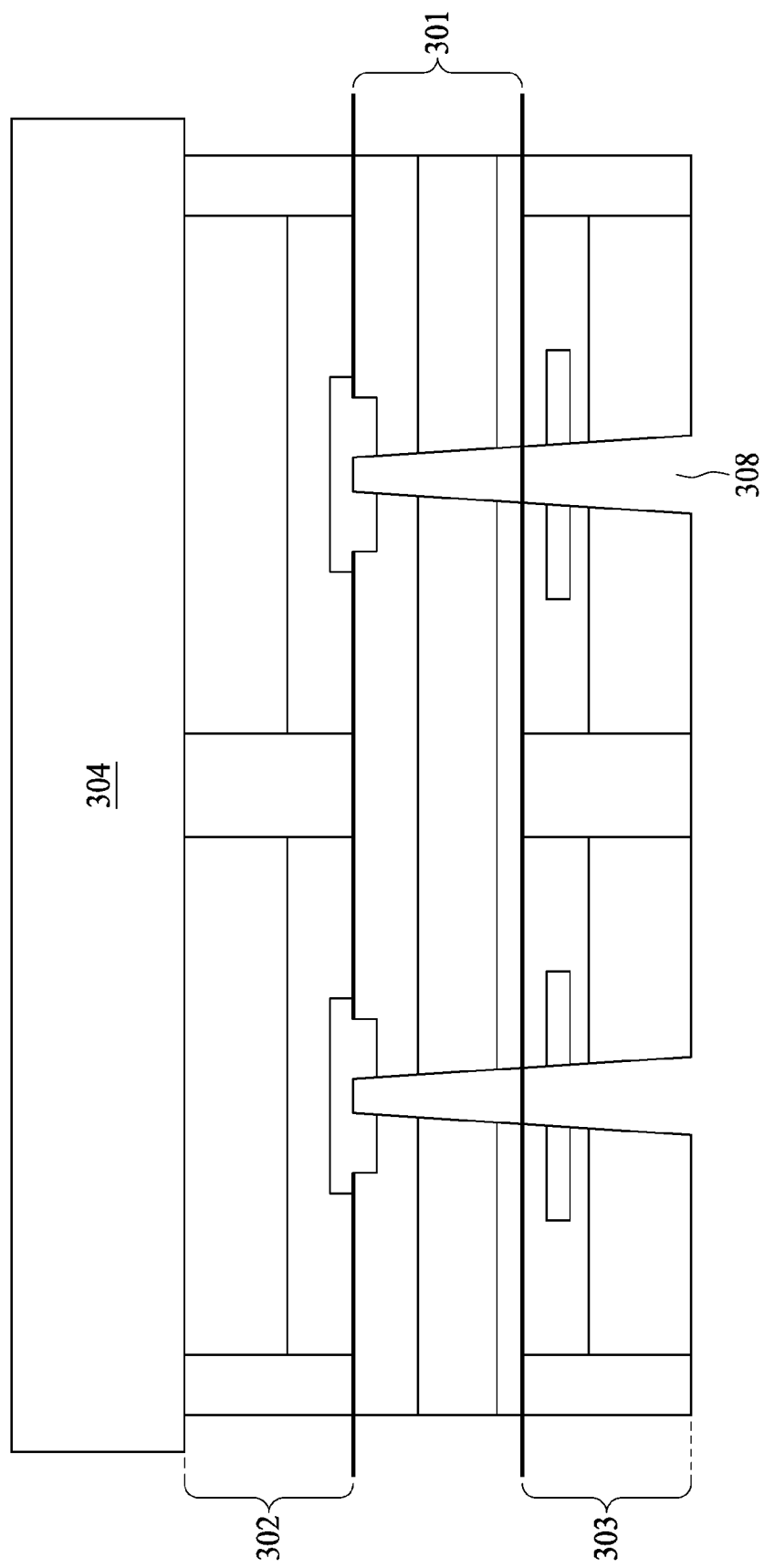

In FIG. 3J, openings 308 through the third semiconductor workpiece 303 and the first semiconductor workpiece 301 are formed. The openings 308 in fact penetrate the third semiconductor workpiece 303 and the first semiconductor workpiece 301 and extend to reach the second semiconductor workpiece 302. The openings 308 may be etched using any suitable etching method including, for example, plasma etch, a chemical wet etch, a laser drill, and/or other processes known in the art. The etching process may result in an opening having a vertical sidewall profile or a tapered sidewall profile.

Figure 3K:
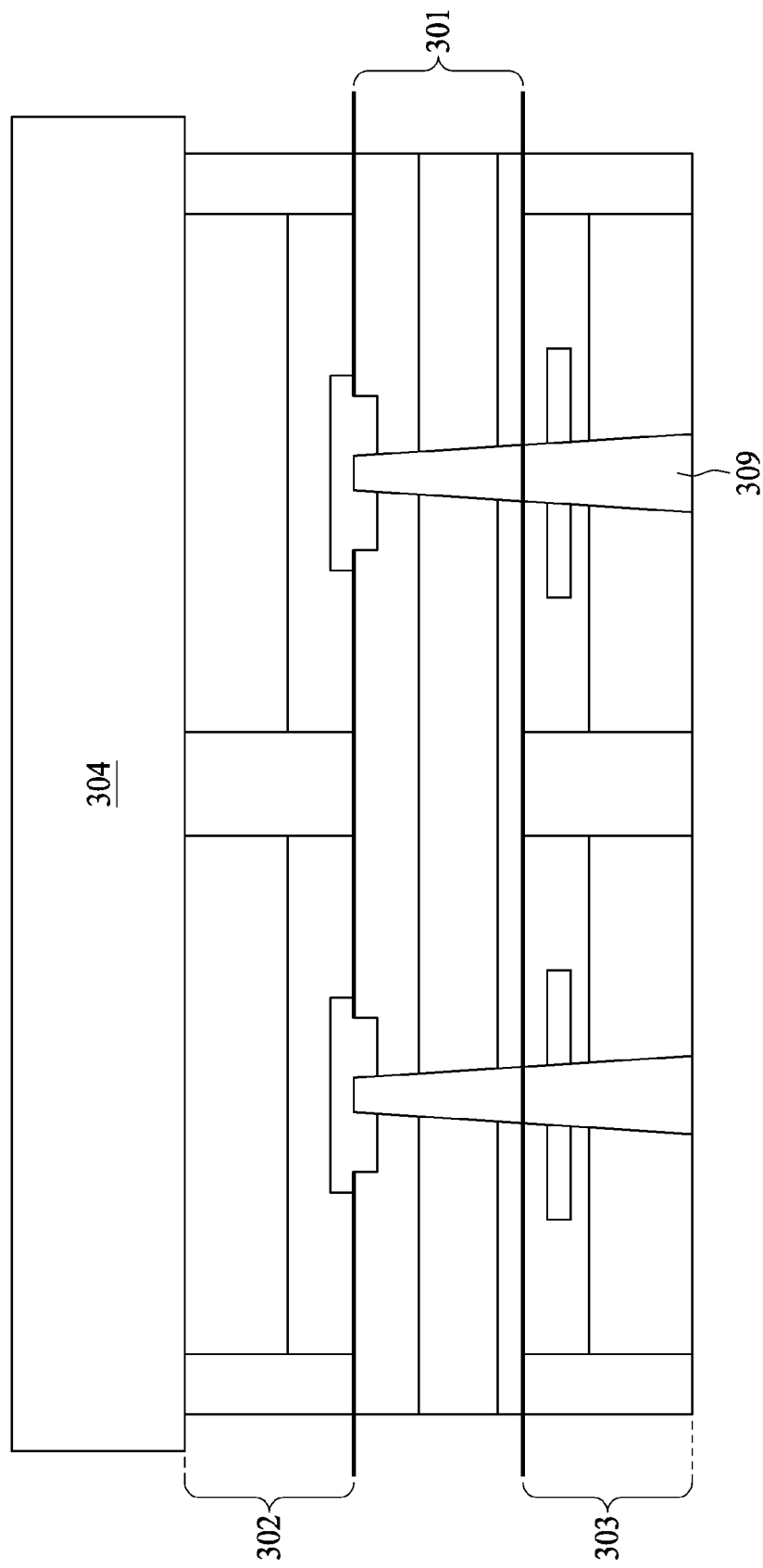

In FIG. 3K, a conductive material is deposited to fill the openings 308 to form electrically conductive vias 309 electrically connecting the microelectronic elements of the first, second and third semiconductor workpieces 301, 302 and 303. In one embodiment, the electrically conductive vias 309 are through silicon vias ("TSV").

Figure 3L:
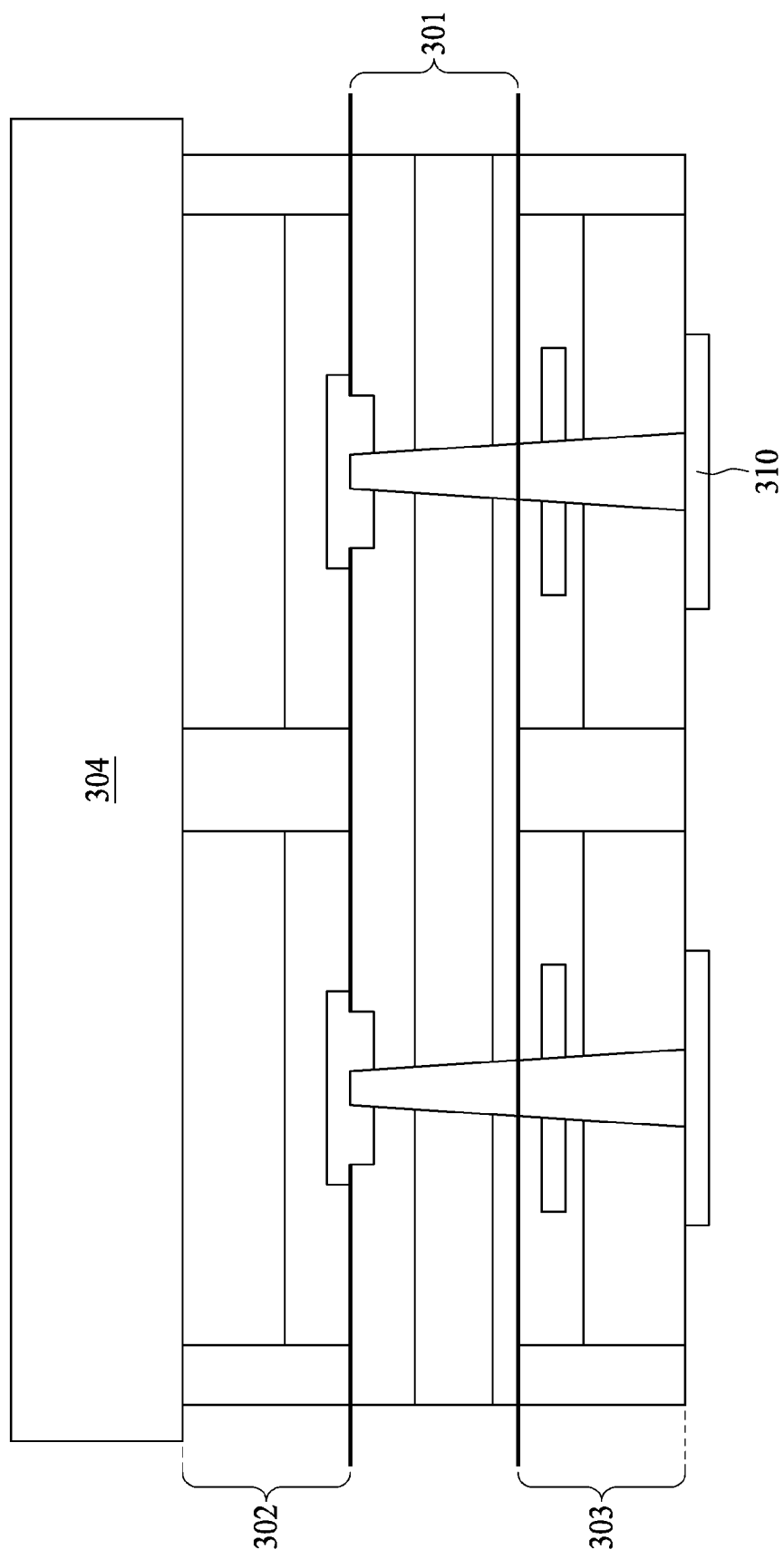

In FIG. 3L, metal pads 310 are formed to cover and electrically connect the electrically conductive vias 309. The metal pads 310 may comprise aluminum, copper or alloys thereof.

Figure 3M:
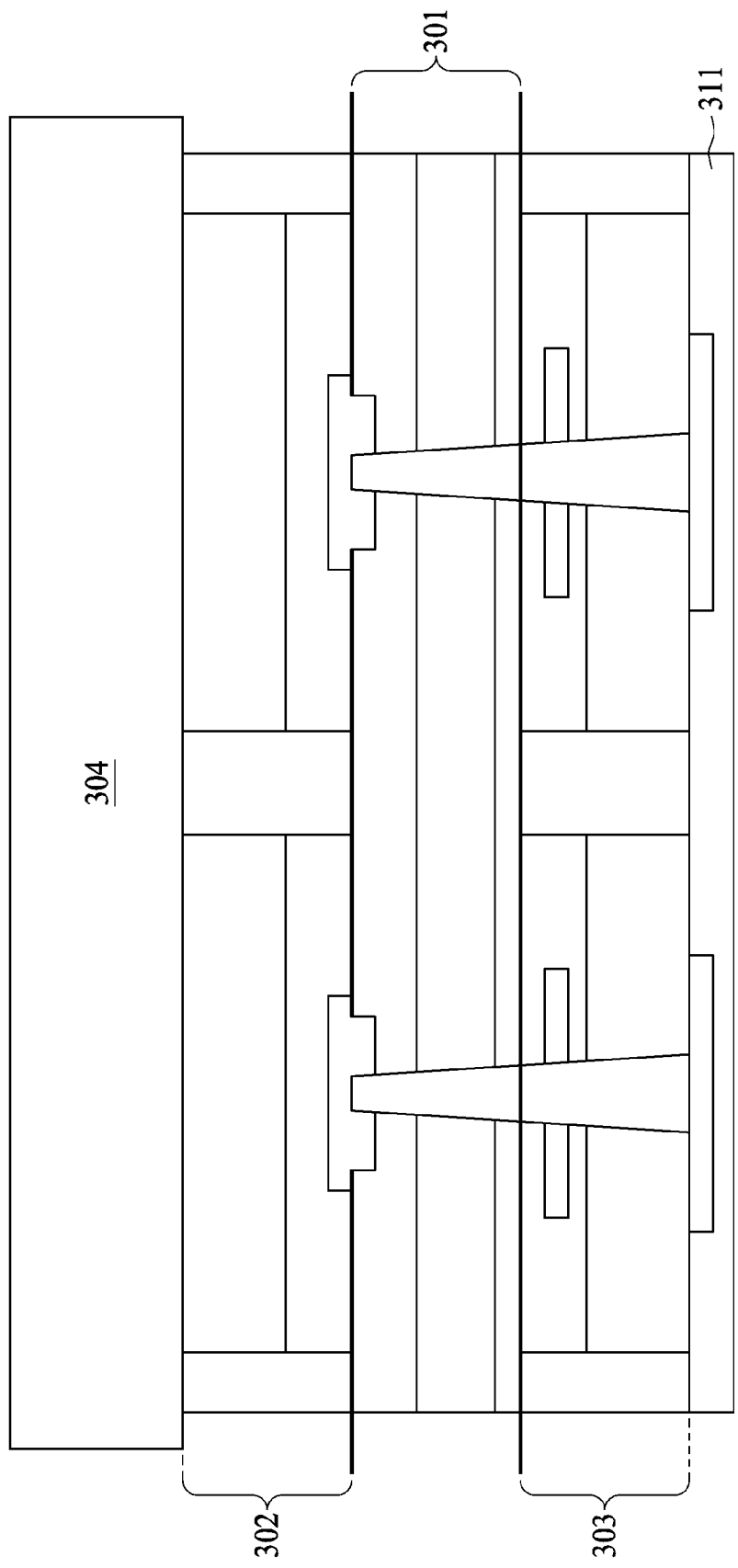

In FIG. 3M, a passivation layer 311 is formed over the third semiconductor workpiece 303 and on top of the metal pads 310 for structural support and physical isolation.

Figure 3N:
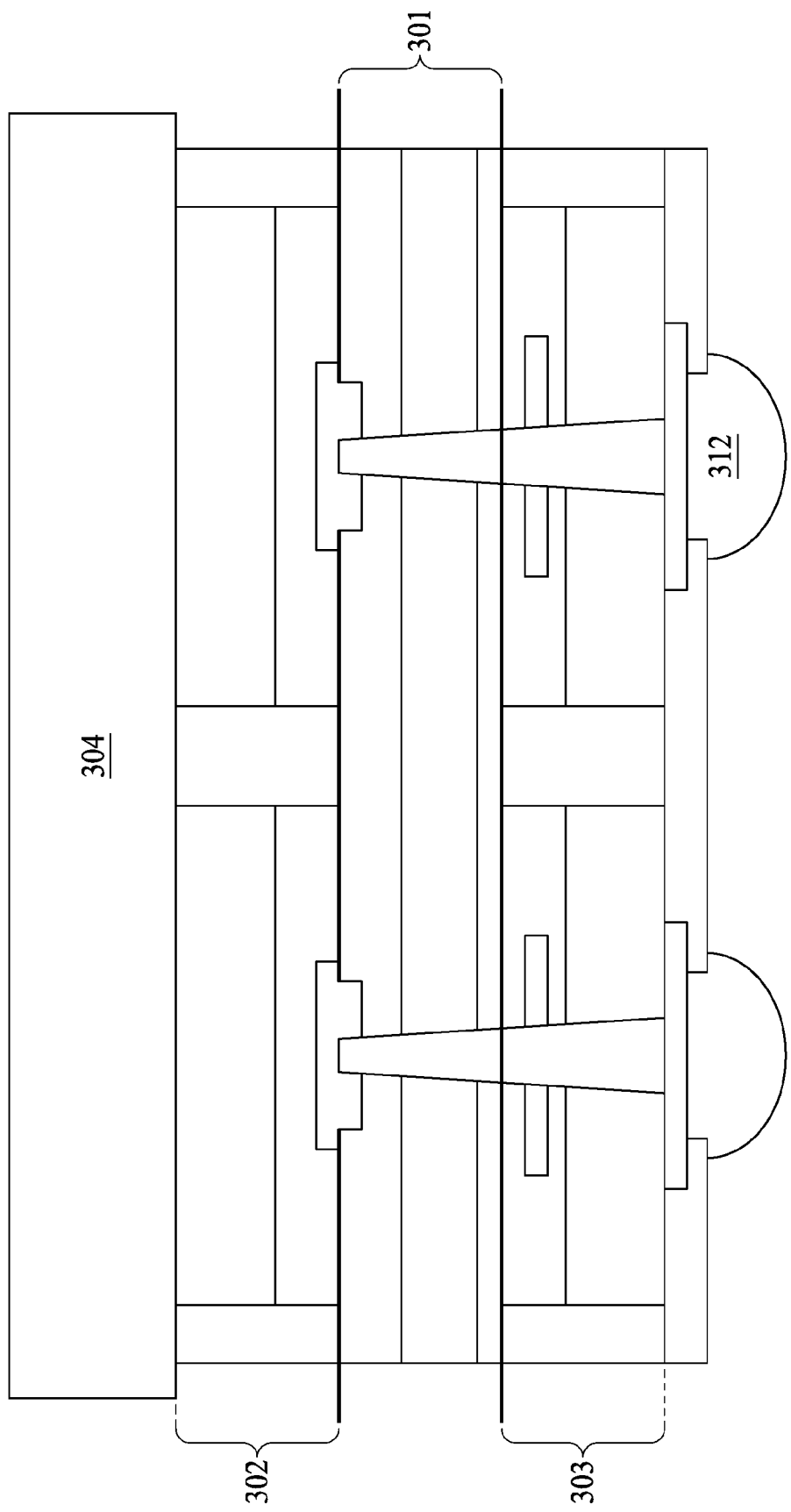
Figure 3O:
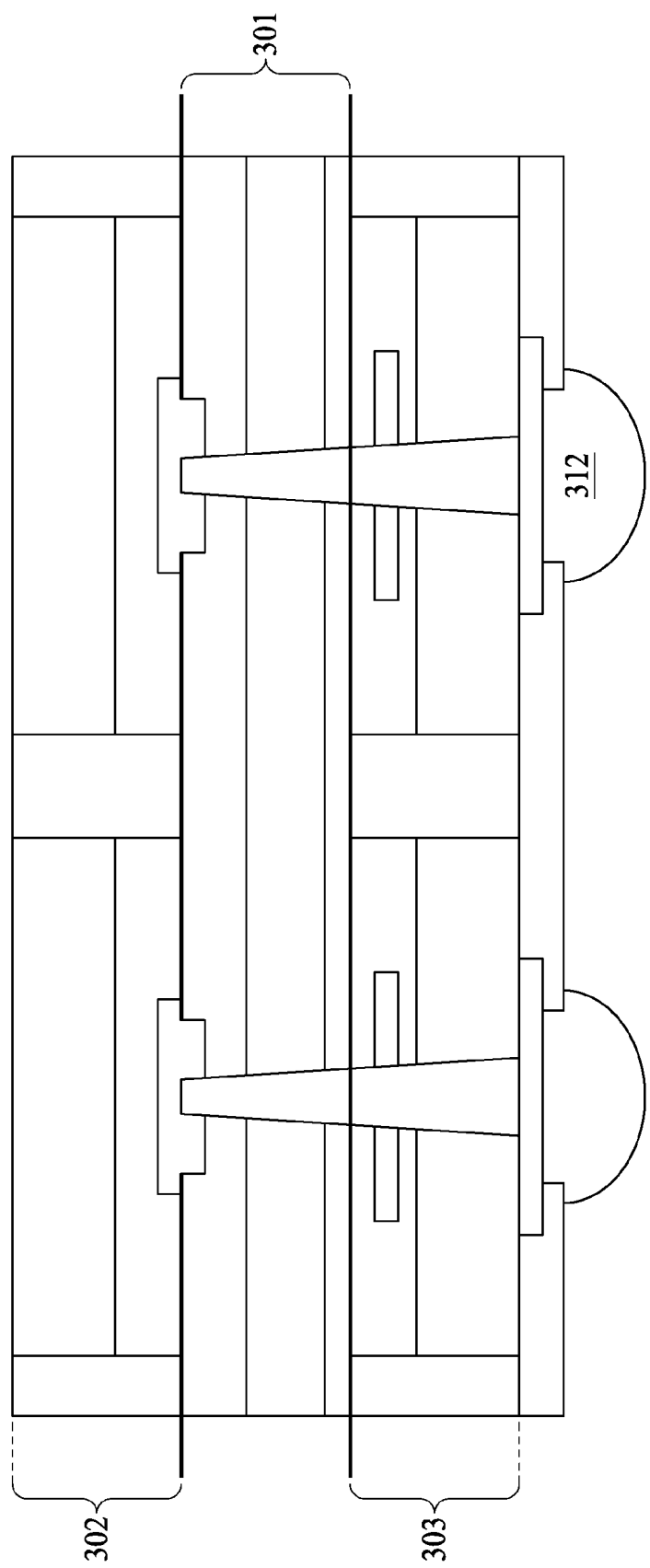

In FIG. 3N, the passivation layer 311 is patterned to include openings so as to expose the metal pads 310. Conductive bumps 312 are formed on the exposed portion of the metal pads 310.

In FIG. 3O, the substrate 304 is de-bonded from the second semiconductor workpiece 302. FIG. 3O shows a semiconductor structure manufactured in accordance with the third method embodiment of the present disclosure.

Figure 4:
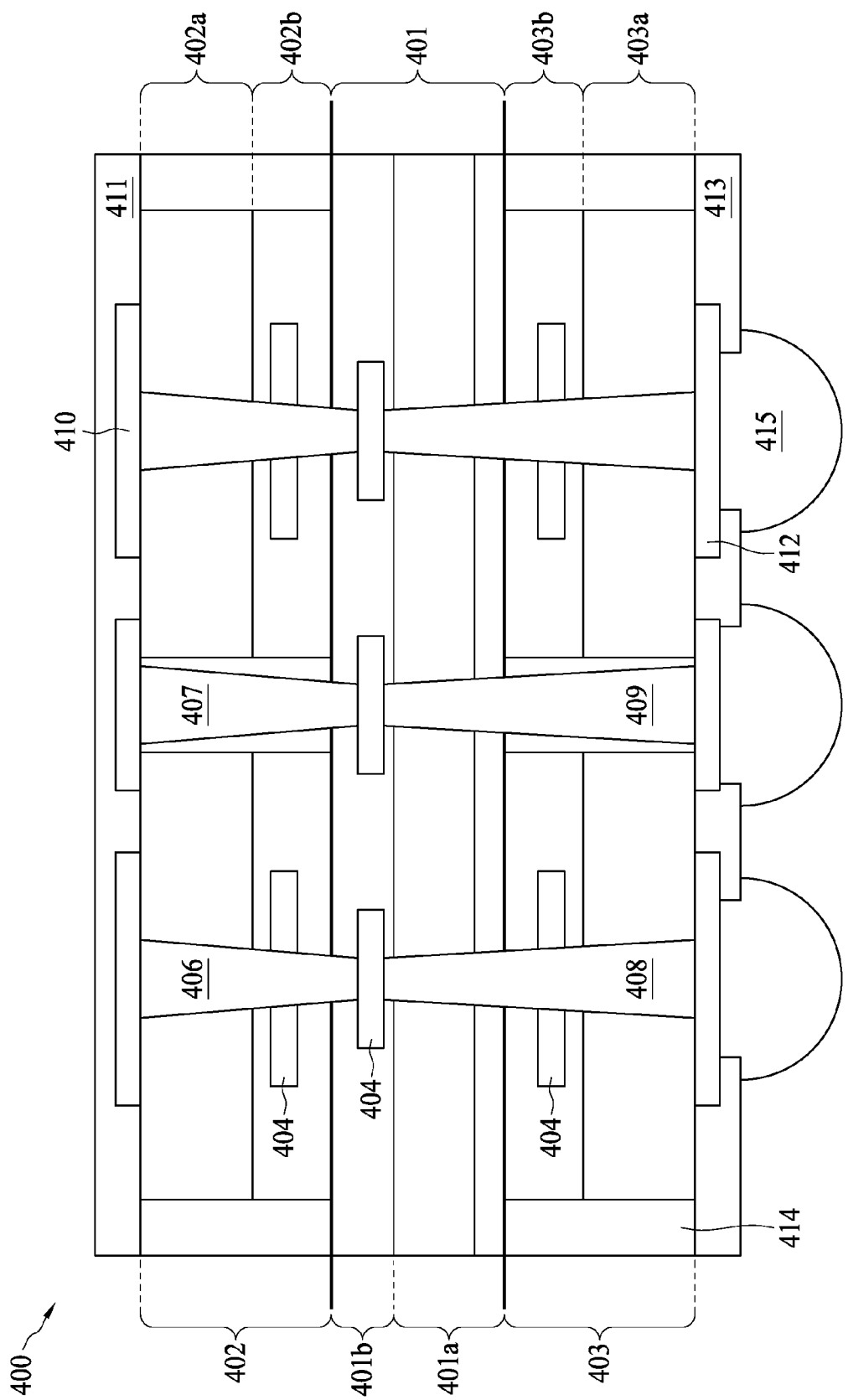
FIG. 4 is a schematic diagram illustrating a semiconductor structure in accordance with one embodiment of the present disclosure.

FIG. 4 is a cross-sectional view illustrating a semiconductor structure 400 in accordance with one embodiment of the present disclosure. The semiconductor structure 400 comprises a first semiconductor workpiece 401 comprising a first substrate 401*a* and a first active layer 401*b*, a second semiconductor workpiece 402 (bonded to the first semiconductor workpiece 401) comprising comprise a second substrate 402*a* and a second active layer 402*b*, and a third semiconductor workpiece 403 (bonded to the first semiconductor workpiece 401) comprising comprise a third substrate 403*a* and a third active layer 403*b*. The first, second and third active layers 401*b*, 402*b* and 403*b* all comprise a plurality of microelectronic elements 404 and metal pads (not shown). The second semiconductor workpiece 402 and the third semiconductor workpiece 403 may comprise a plurality of semiconductor dies (KGD) and the gaps between adjacent semiconductor dies are filled with dielectric materials 414. The semiconductor structure 400 comprises: TSVs 406 and 408 electrically connecting metal pads 410 and 412 to some of the microelectronic elements 404; and TDVs 407 and 409 electrically connecting the metal pads 410 and 412 to some of the microelectronic elements 404. A passivation layer 411 is formed over the third semiconductor workpiece 303 and on top of the metal pads 410 and a passivation layer 413 is formed over the third semiconductor workpiece 403 and on top of the metal pads 412. Conductive bumps 415 are formed on the exposed portion of the metal pads 412. The TSVs 406 and the TSVs 408 are formed to taper toward opposite directions and the TDVs 407 and TDVs 409 are formed to taper toward opposite directions. Additionally semiconductor workpieces may be provided and stacked on both sides of the semiconductor structure 400.

Figure 5:
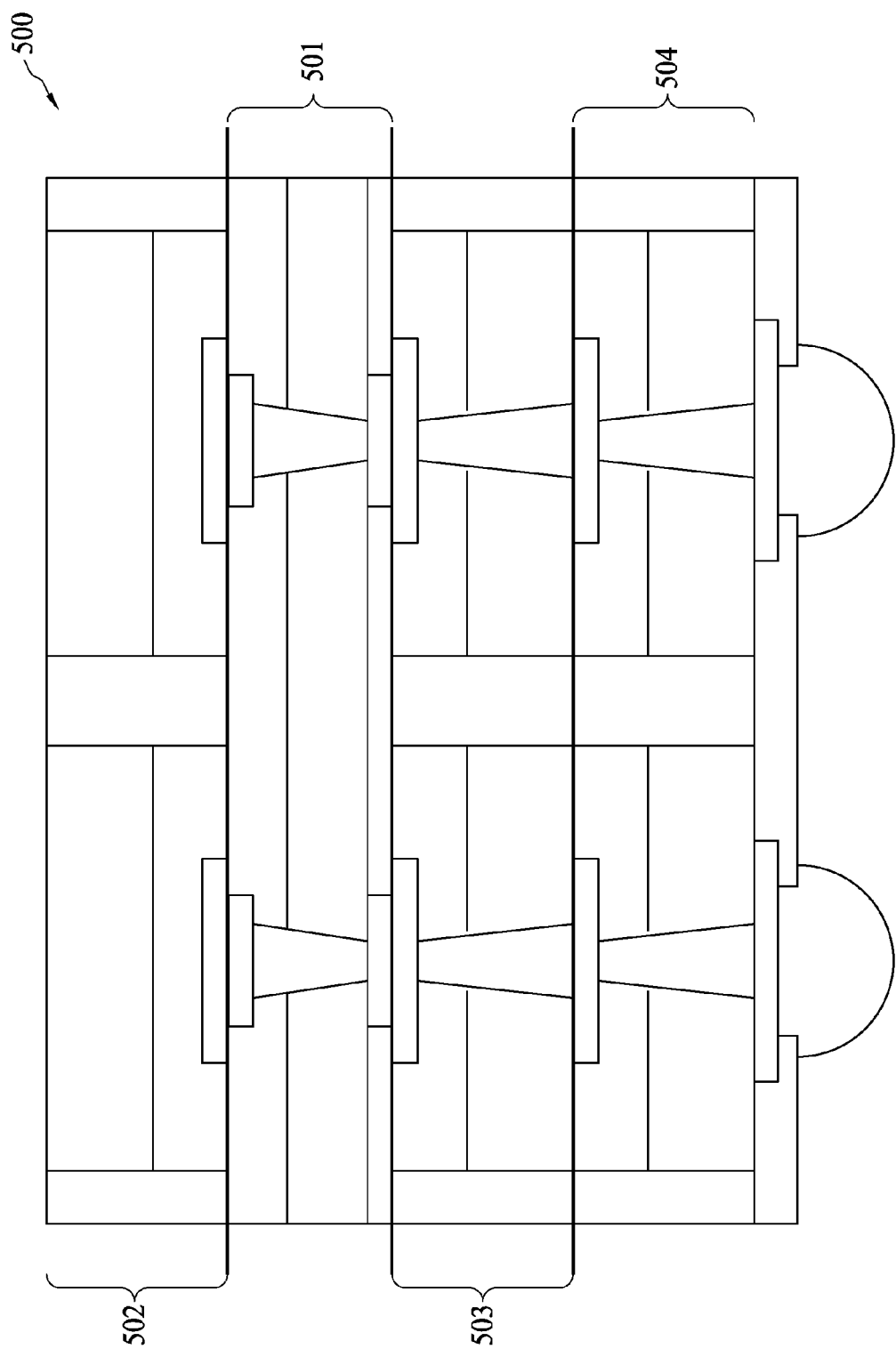
FIG. 5 is a schematic diagram illustrating a semiconductor structure in accordance with one embodiment of the present disclosure.

FIG. 5 is a cross-sectional view illustrating a semiconductor structure 500 in accordance with one embodiment of the present disclosure. The semiconductor structure 500 comprises a first semiconductor workpiece 501 comprising a first substrate and a first active layer, a second semiconductor workpiece 502 (bonded to one side of the first semiconductor workpiece 501) comprising comprise a second substrate and a second active layer, and a third semiconductor workpiece 503 (bonded to the other side of the first semiconductor workpiece 501) comprising comprise a third substrate and a third active layer. The semiconductor structure 500 further comprises a fourth semiconductor workpiece 504 (bonded to the third semiconductor workpiece 503) comprising a first substrate and a first active layer. In one embodiment, the semiconductor structure 500 may be formed by bonding/stacking a predetermined number of semiconductor workpieces on one another (not shown). In one embodiment, the semiconductor structure 500 may be formed by bonding/stacking a predetermined number of semiconductor workpieces on either side of a base semiconductor workpiece (not shown) utilizing the method as shown in FIGS. 1-3.

Figure 6:
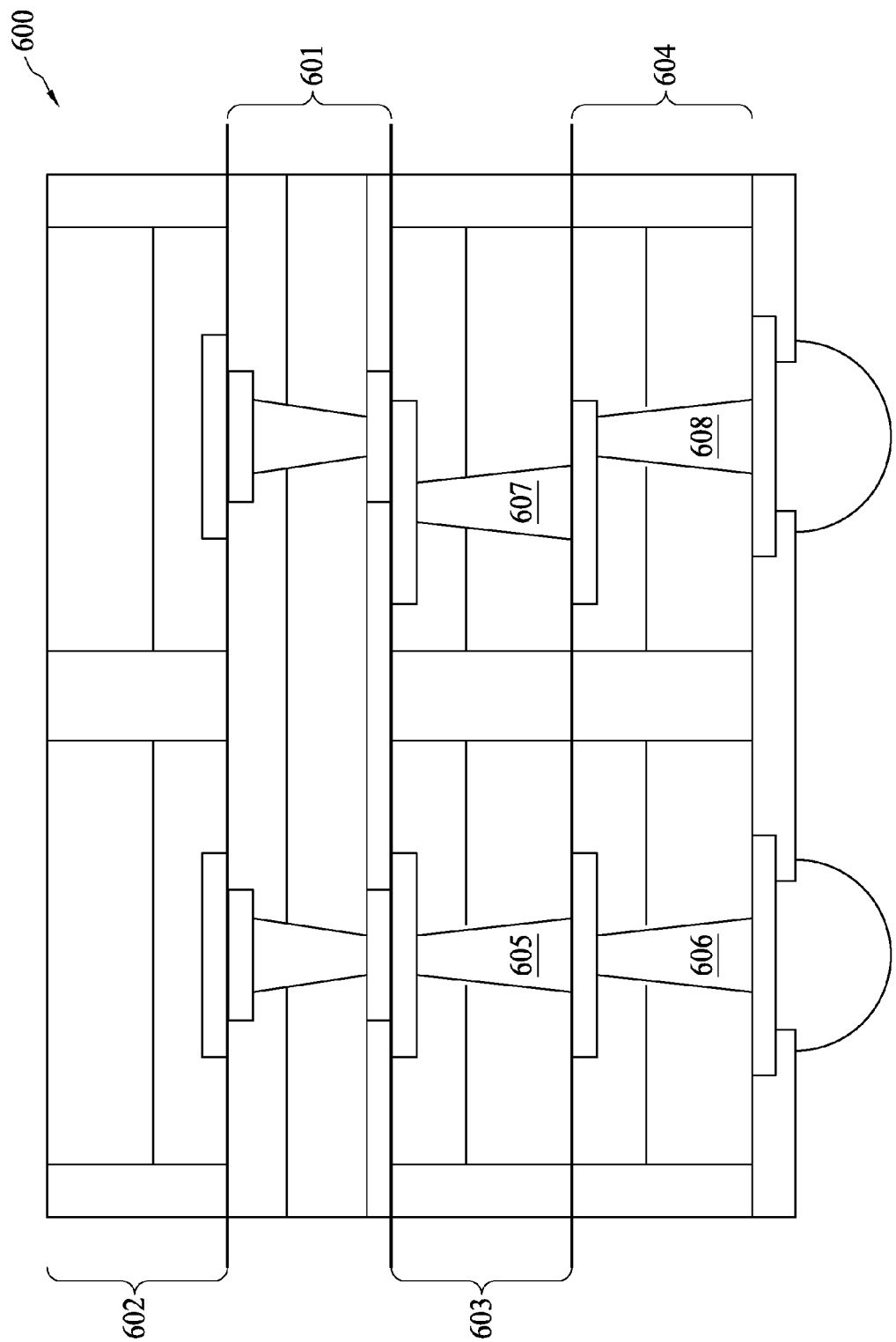
FIG. 6 is a schematic diagram illustrating a semiconductor structure in accordance with one embodiment of the present disclosure.

FIG. 6 is a cross-sectional view illustrating a semiconductor structure 600 in accordance with one embodiment of the present disclosure. The semiconductor structure 600 comprises a first semiconductor workpiece 601, a second semiconductor workpiece 602 (bonded to one side of the first semiconductor workpiece 601), a third semiconductor workpiece 603 (bonded to the other side of the first semiconductor workpiece 601) and a fourth semiconductor workpiece 604 (bonded to the third semiconductor workpiece 603). The semiconductor structure 600 is characterized in that TSV 605 and TSV 606 are arranged in a stacked configuration ("stacked TSV") in which the bottom end of TSV 605 is above or adjacent to the top end of TSV 606 (i.e., TSV 605 and TSV 606 are linearly aligned), while TSV 607 and TSV 608 are arranged in a staggered configuration ("staggered TSV") in which TSV 607 and TSV 608 are not linearly aligned. In one embodiment, the semiconductor structure 600 may also comprise TDVs (not shown) arranged in a stacked configuration or staggered configuration or both.

Figure 7A:
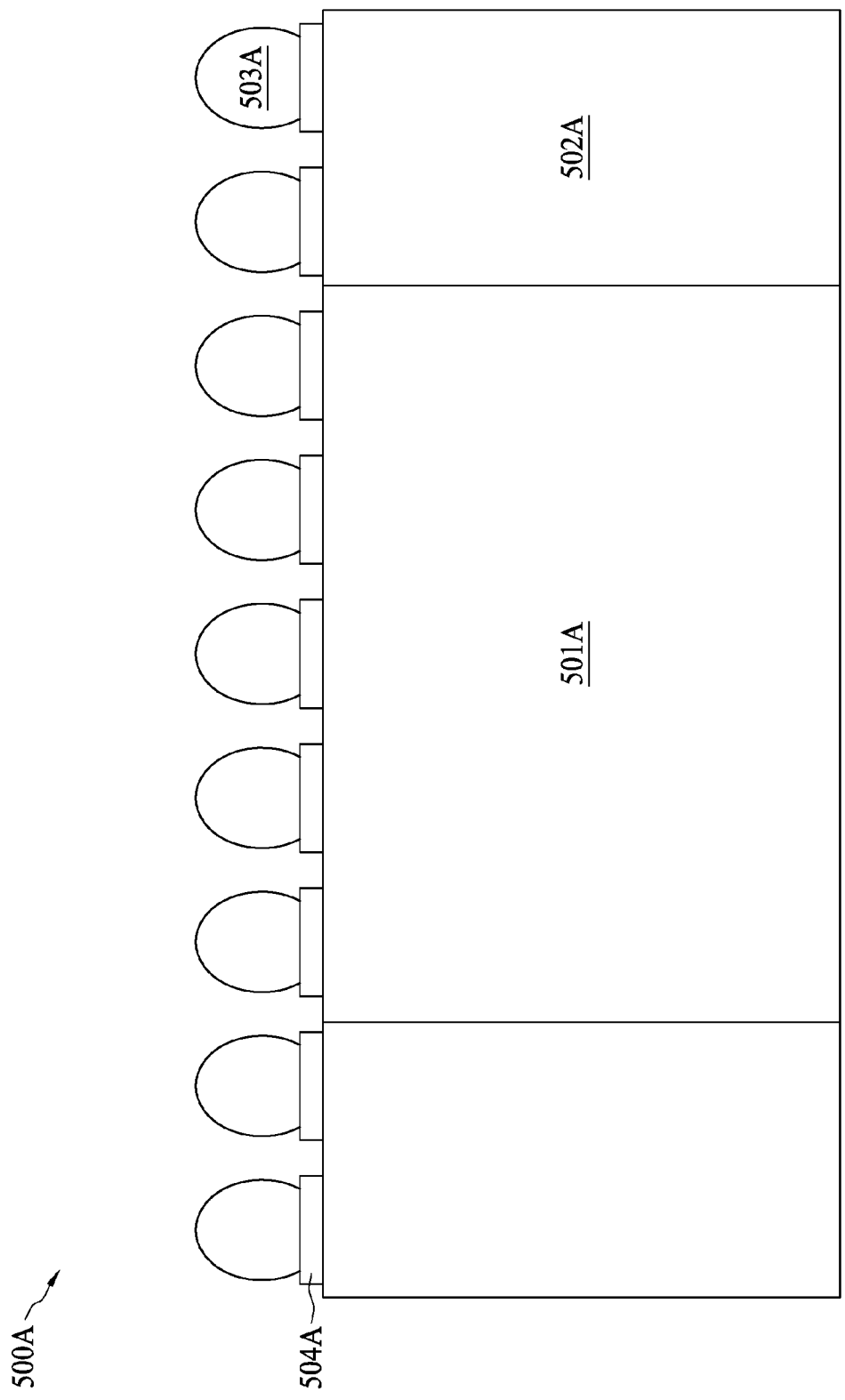
FIGS. 7A and 7B are schematic diagrams illustrating semiconductor InFO structures in accordance with one embodiment of the present disclosure.
Figure 7B:
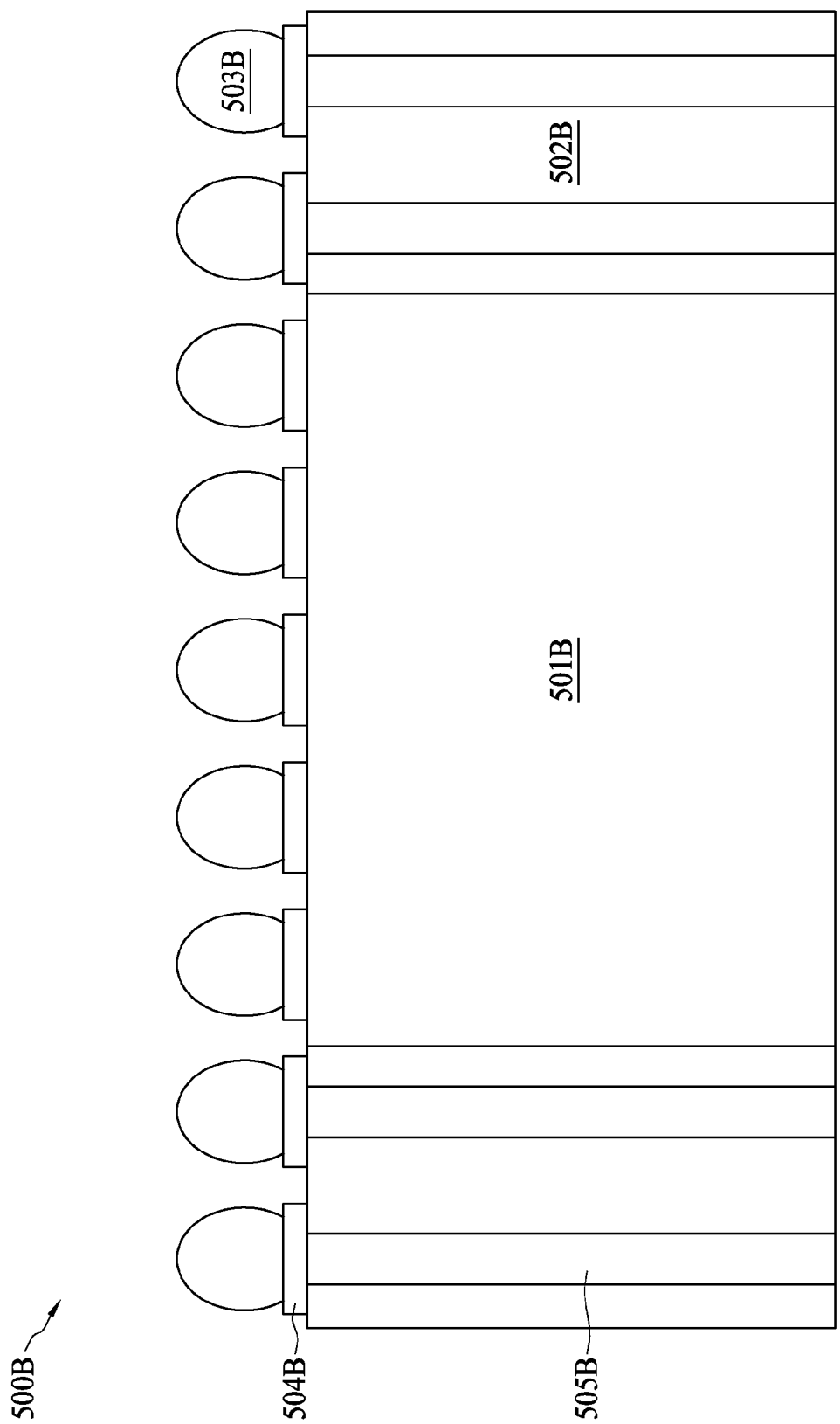

In one embodiment, the semiconductor structure 400 of FIG. 4 can be integrated as a "system on integrated chip" (SoIC) unit and then implemented into integrated fan-out (InFo) or Chip-On-Wafer-On-Substrate (CoWoS) structures. FIG. 7A is a schematic diagram illustrating a semiconductor InFo structure 700A in accordance with one embodiment of the present disclosure. In FIG. 7A, a SoIC structure unit 701A (which can be the semiconductor structure 400 of FIG. 4) is embedded within dielectric/interposer 702A, wherein the I/Os of the SoIC structure unit 701A are connected to external electrical contacts (not shown) through metal pads 704A and conductive bumps 703A. The semiconductor InFo structure 700A allows signals to fan out to regions larger than the silicon die footprint of the SoIC structure unit 701A. FIG. 7B is a schematic diagram illustrating a semiconductor InFo structure 700B in accordance with one embodiment of the present disclosure. In FIG. 7B, a SoIC structure unit 701B (which can be the semiconductor structure 400 of FIG. 4) is embedded within dielectric/interposer 702B, wherein the I/Os of the SoIC structure unit 701B are connected to external electrical contacts (not shown) through metal pads 704B and conductive bumps 703B, wherein some of the metal pads 704B and conductive bumps 703B are connected to via structures 705B.

Figure 8:
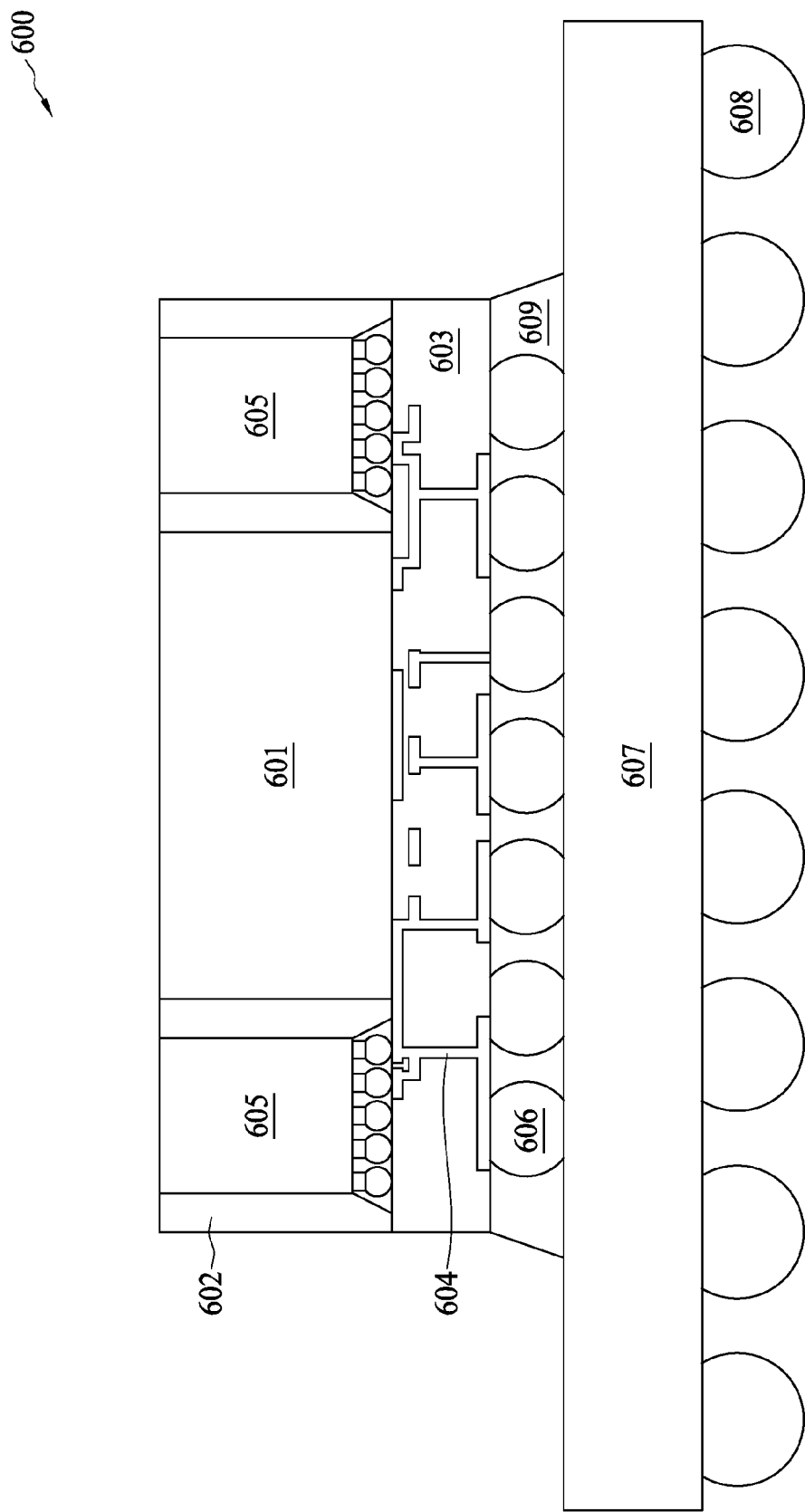
FIG. 8 is a schematic diagram illustrating a semiconductor CoWoS structure in accordance with one embodiment of the present disclosure.

FIG. 8 is a schematic diagram illustrating a semiconductor CoWoS structure 800 in accordance with one embodiment of the present disclosure. In FIG. 8, a SoIC structure unit 801 (which can be the semiconductor structure 400 of FIG. 4) is embedded within dielectric 802 and disposed on a wafer layer 803. In one embodiment, the wafer layer 803 is an interposer. Semiconductor chips 805 are also provided on the wafer layer 803, wherein the semiconductor chips 805 and the SoIC structure unit 801 are electrically connected to conductive bumps 806 (within molding compound 809) provided on a substrate 807 via interconnects 804 (e.g., TSV) within the wafer layer 803, and the conductive bumps 806 are electrically connected to external electrical contacts (not shown) through conductive bumps 808. The semiconductor CoWoS structure 800 uses interconnects 804 to integrate multiple chips (e.g., the semiconductor chips 805 and the SoIC structure unit 801) into a single device. This architecture provides higher density interconnects and decreases global interconnect length, thus resulting in enhanced performance and reduced power consumption on a smaller form factor.

Some embodiments of the present disclosure provide a method for forming a semiconductor structure comprising: providing a first semiconductor workpiece; bonding a second semiconductor workpiece to a first surface of the first semiconductor workpiece; forming a first electrically conductive via through the second semiconductor workpiece to the first semiconductor workpiece; bonding a third semiconductor workpiece to a second surface of the first semiconductor workpiece, the second surface being opposite to the first surface; and forming a second electrically conductive via through the first semiconductor workpiece and the third semiconductor workpiece to the second semiconductor workpiece such that the first electrically conductive via and the second electrically conductive via are electrically connected.

Some embodiments of the present disclosure provide a method for forming a semiconductor structure comprising: providing a first semiconductor workpiece comprising a first substrate and a first active layer; bonding a second semiconductor workpiece to the first active layer, wherein the second semiconductor workpiece comprises a second substrate and a second active layer; bonding a third semiconductor workpiece to the first substrate, wherein the third semiconductor workpiece comprises a third substrate and a third active layer; and forming an electrically conductive via connecting the first, second and third active layers.

Some embodiments of the present disclosure provide a semiconductor structure, comprising: a first semiconductor workpiece; a second semiconductor workpiece bonded to a first surface of the first semiconductor workpiece; a third semiconductor workpiece bonded to a second surface of the first semiconductor workpiece; and a plurality of conductive vias electrically connecting the first semiconductor workpiece, the second semiconductor workpiece and the third semiconductor workpiece, wherein a first conductive via is tapered in a direction toward the second semiconductor workpiece.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A method for forming a semiconductor structure comprising:
providing a first semiconductor workpiece;
bonding a second semiconductor workpiece to a first surface of the first semiconductor workpiece, wherein the second semiconductor workpiece includes two adjacent semiconductor dies with a gap arranged therebetween;
filing the gap with a dielectric material;
forming an opening through the dielectric material between the adjacent semiconductor dies and into the first semiconductor workpiece;
filling the opening with conductive material to form a first electrically conductive via extended into and electrically connected to the first semiconductor workpiece;
bonding a third semiconductor workpiece to a second surface of the first semiconductor workpiece, the second surface being opposite to the first surface; and
forming a second electrically conductive via extended into the first semiconductor workpiece and substantially aligned with the first electrically conductive via such that the first electrically conductive via connects the second electrically conductive via.

2. The method of claim 1, wherein bonding the second semiconductor workpiece and the third semiconductor workpiece to the first semiconductor workpiece comprises fusion bonding, hybrid bonding, eutectic bonding or adhesive bonding.

3. The method of claim 1, wherein forming the first electrically conductive via comprises forming a through silicon via (TSV) or a through die via (TDV) through the second semiconductor workpiece to electrically connect the first semiconductor workpiece.

4. The method of claim 1, wherein forming the second electrically conductive via comprises forming a through silicon via (TSV) or a through die via (TDV) through the third semiconductor workpiece to electrically connect the first semiconductor workpiece.

5. The method of claim 1, wherein the first electrically conductive via and the second electrically conductive via are formed to taper toward opposite directions.

6. The method of claim 1, further comprising:
prior to bonding the third semiconductor workpiece to the first semiconductor workpiece, bonding a substrate to the second semiconductor workpiece and thinning the first semiconductor workpiece from the second surface; and de-bonding the substrate after forming the second electrically conductive via.

7. The method of claim 1, wherein thinning the first semiconductor workpiece comprises thinning the first semiconductor workpiece to be less than about 10 micron thick.

8. The method of claim 1, further comprising: prior to forming the second electrically conductive via, thinning the third semiconductor workpiece to be less than about 50 micron thick.

9. A method for forming a semiconductor structure comprising:
    providing a first semiconductor workpiece;
    bonding a first semiconductor die and a second semiconductor die to a first surface of the first semiconductor workpiece, wherein the first semiconductor die and the second semiconductor die are separated by a first gap;
    filling the first gap between the first semiconductor die and the second semiconductor die by a dielectric material;
    bonding a third semiconductor die and a fourth semiconductor die to an opposite second surface of the first semiconductor workpiece, wherein the third semiconductor die and the fourth semiconductor die are separated by a second gap that at least partially overlaps the first gap;
    filling the second gap between the third semiconductor die and the fourth semiconductor die by the dielectric material;
    forming a first opening and a second opening through the dielectric material filling the first and the second gaps, respectively, wherein at least one of the first opening and the second opening extend into the first semiconductor workpiece; and
    filling the first opening and the second opening by a conductive material to form through stack via that enables electrical connection through the first and second gaps and the first semiconductor workpiece.

10. The method of claim 9, wherein forming the first electrically conductive via and the second electrically conductive via comprises forming a through silicon via (TSV) or a through die via (TDV).

11. The method of claim 9, wherein the first semiconductor die, the second semiconductor die, the third semiconductor die, and the fourth semiconductor die comprise known good dies (KGD) and the first semiconductor workpiece comprises a known good wafer (KGW).

12. The method of claim 9, further comprising:
    prior to bonding the third semiconductor die and the fourth semiconductor die to the first semiconductor workpiece, bonding a substrate to the first semiconductor die and the second semiconductor die, and thinning the first semiconductor workpiece; and
    de-bonding the substrate after forming the electrically conductive via.

13. The method of claim 9, wherein forming the electrically conductive via comprises forming an insulation layer surrounding the electrically conductive via.

14. The method of claim 9, wherein the first semiconductor die and the second semiconductor die are adjacent to the first surface of the first semiconductor workpiece.

15. The method of claim 9, wherein the third semiconductor die and the fourth semiconductor die are adjacent to the opposite second surface of the first semiconductor workpiece.

16. The method of claim 9, further comprising bonding a fifth semiconductor die and a sixth semiconductor die to the first semiconductor die and the second semiconductor die respectively, or to the third semiconductor die and the fourth semiconductor die respectively.

17. The method of claim 9, further comprising thinning down the first semiconductor workpieces, the first semiconductor die, the second semiconductor die, the third semiconductor die, or the fourth semiconductor die to be less than about 50 micron thick.

18. The method of claim 1, further comprising:
    forming a metal pad to cover and electrically connect the first electrically conductive via.

19. The method of claim 1, further comprising:
    forming a metal pad to cover and electrically connect the second electrically conductive via.

20. The method of claim 19, further comprising:
    forming a conductive bump on the metal pad.

* * * * *